United States Patent
Lee et al.

(10) Patent No.: US 11,881,256 B2
(45) Date of Patent: Jan. 23, 2024

(54) SEMICONDUCTOR MEMORY DEVICE AND METHOD OF CONTROLLING LOAD OF GLOBAL INPUT-OUTPUT LINES OF THE SAME

(71) Applicant: Samsung Electronics Co., Ltd., Suwon-si (KR)

(72) Inventors: Seoulmin Lee, Hwaseong-si (KR); Seokjin Cho, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 137 days.

(21) Appl. No.: 17/574,655

(22) Filed: Jan. 13, 2022

(65) Prior Publication Data
US 2022/0399053 A1 Dec. 15, 2022

(30) Foreign Application Priority Data
Jun. 9, 2021 (KR) .......................... 10-2021-0074684

(51) Int. Cl.
| | | |
|---|---|---|
| G11C 11/4096 | (2006.01) | |
| G11C 11/4093 | (2006.01) | |
| G11C 5/06 | (2006.01) | |
| G11C 11/4074 | (2006.01) | |
| G11C 11/408 | (2006.01) | |

(52) U.S. Cl.
CPC ............ *G11C 11/4096* (2013.01); *G11C 5/06* (2013.01); *G11C 11/4074* (2013.01); *G11C 11/4085* (2013.01); *G11C 11/4093* (2013.01)

(58) Field of Classification Search
CPC ... G11C 11/4096; G11C 5/06; G11C 11/4074; G11C 11/4085; G11C 11/4093
See application file for complete search history.

(56) References Cited

U.S. PATENT DOCUMENTS

| | | | |
|---|---|---|---|
| 6,188,631 B1 | 2/2001 | Lee et al. | |
| 6,421,294 B2 * | 7/2002 | Hidaka | ............... G11C 11/4096 |
| | | | 365/230.01 |

(Continued)

FOREIGN PATENT DOCUMENTS

| | | |
|---|---|---|
| KR | 100351048 B1 | 9/2002 |
| KR | 100465602 B1 | 1/2005 |

(Continued)

*Primary Examiner* — Min Huang
(74) *Attorney, Agent, or Firm* — Muir Patent Law, PLLC

(57) ABSTRACT

A semiconductor memory device includes data pads, wordlines, memory cells, global input-output lines, and intrabank switches. The wordlines extend in a row direction and are arranged in a column direction. The wordlines are grouped into wordline groups such that each wordline group includes wordlines adjacent in the column direction. A selection wordline is selected based on a row address. The global input-output lines extend in the column direction and are arranged in the row direction to transfer data between the data pads and the memory cells. The global input-output lines are cut into line segment groups respectively corresponding to the wordline groups. The intra-bank switches control, based on the row address, electrical connections between two line segment groups among the line segment groups, where the two line segment groups are adjacent in the column direction and included in one memory bank.

18 Claims, 19 Drawing Sheets

(56) References Cited

U.S. PATENT DOCUMENTS

| | | |
|---|---|---|
| 6,870,205 B2 | 3/2005 | Lee et al. |
| 7,206,213 B2 | 4/2007 | Kim |
| 7,668,036 B2 | 2/2010 | Kim |
| 8,971,108 B2 | 3/2015 | Park |
| 9,607,666 B2 | 3/2017 | Lym |
| 9,607,667 B1 * | 3/2017 | Lee ................ G11C 7/1069 |
| 11,126,548 B1 * | 9/2021 | Yudanov ............... G11C 8/08 |
| 2011/0035644 A1 * | 2/2011 | Madan ............. G06F 11/1048 |
| | | 714/E11.03 |
| 2012/0314520 A1 * | 12/2012 | Vogelsang ............. G11C 8/14 |
| | | 365/200 |
| 2016/0042772 A1 * | 2/2016 | Choi .............. G11C 29/1201 |
| | | 365/191 |

FOREIGN PATENT DOCUMENTS

| | | |
|---|---|---|
| KR | 100480902 B1 | 6/2005 |
| KR | 1020060023200 A | 3/2006 |
| KR | 100571625 B1 | 4/2006 |
| KR | 100576488 B1 | 5/2006 |

\* cited by examiner

| Rq | Rq-1 | WLs | RSG1 | RSG2 | RSG3 |
|----|------|-----|------|------|------|
| 0  | 0    | WG1 | OFF  | OFF  | OFF  |
| 0  | 1    | WG2 | ON   | OFF  | OFF  |
| 1  | 0    | WG3 | ON   | ON   | OFF  |
| 1  | 1    | WG4 | ON   | ON   | ON   |

FIG. 14

| Rq | WLs | RSG |
|---|---|---|
| 0 | WG1 | OFF |
| 1 | WG2 | ON |

FIG. 18

| Bi | Rq | BNKs | Ws | RSG2 (SWB) | RSG1 (SWA) | RSG3 (SWA) |
|---|---|---|---|---|---|---|
| 0 | 0 | BNK1 | WG11 | OFF | OFF | ON |
| 0 | 1 | BNK1 | WG12 | OFF | ON | ON |
| 1 | 0 | BNK2 | WG21 | ON | ON | OFF |
| 1 | 1 | BNK2 | WG22 | ON | ON | ON |

SEMICONDUCTOR MEMORY DEVICE AND METHOD OF CONTROLLING LOAD OF GLOBAL INPUT-OUTPUT LINES OF THE SAME

CROSS-REFERENCE TO RELATED APPLICATION

This U.S. non-provisional application claims priority under 35 U.S.C. § 119 to Korean Patent Application No. 10-2021-0074684, filed on Jun. 9, 2021, in the Korean Intellectual Property Office (KIPO), the disclosure of which is incorporated by reference herein in its entirety.

BACKGROUND

1. Technical Field

Example embodiments relate generally to semiconductor integrated circuits, and more particularly to a semiconductor memory device and a method of controlling load of global input-output lines of the semiconductor memory device.

2. Discussion of the Related Art

In general, data lines used in a semiconductor memory device may include local input-output lines, global input-output lines, etc. depending on locations of the data lines. In case of a read operation, data on a bitline is amplified and then applied to a local input-output line based on a column selection signal. A read driver may amplify the data on the local input-output line and apply the amplified data to a global input-output line. The global input-output line may be commonly connected to a plurality of memory banks and each memory bank may drive the global input-output line. An input-output sense amplifier may drive a data pad based on the data on the global input-output line.

As memory capacity of the semiconductor memory device increases, the length of the global input-output line may be increased and driving load of the global input-output line is increased. Thus, power consumption may be increased and operation speed may be decreased as the memory capacity of the semiconductor memory device increases. If a driving capacity of a circuit to drive the global input-output line is increased to enhance the operation speed, a size of the semiconductor memory device may be increased.

SUMMARY

Some example embodiments may provide a semiconductor memory device and a method of controlling load of global input-output lines of the semiconductor memory device capable of reducing the load of the global input-output lines.

According to example embodiments, a semiconductor memory device includes a plurality of data pads connected to a memory controller, a plurality of wordlines, a plurality of memory cells connected to the plurality of wordlines, a plurality of global input-output lines, and a plurality of intra-bank switches. The plurality of wordlines extend in a row direction and are arranged in a column direction. The plurality of wordlines are grouped into a plurality of wordline groups such that each wordline group includes wordlines adjacent in the column direction. A selection wordline is selected based on a row address. The plurality of global input-output lines extend in the column direction and are arranged in the row direction to transfer data between the plurality of data pads and the plurality of memory cells. The plurality of global input-output lines are cut into a plurality of line segment groups respectively corresponding to the plurality of wordline groups. The plurality of intra-bank switches control, based on the row address, electrical connections between two line segment groups among the plurality of line segment groups, where the two line segment groups are adjacent in the column direction and included in one memory bank.

According to example embodiments, a semiconductor memory device includes, a plurality of data pads connected to a memory controller, a plurality of wordlines extending in a row direction and arranged in a column direction, the plurality of wordlines being grouped into a plurality of wordline groups such that each wordline group includes wordlines adjacent in the column direction, a selection wordline being selected based on a row address, a plurality of memory cells connected to the plurality of wordlines, the plurality of memory cells forming a plurality of memory banks, a selection memory bank being selected based on a bank address, a plurality of global input-output lines extending in the column direction and arranged in the row direction to transfer data between the plurality of data pads and the plurality of memory cells, the plurality of global input-output lines being cut into a plurality of line segment groups respectively corresponding to the plurality of wordline groups, a plurality of intra-bank switches configured to control, based on the bank address and the row address, electrical connections between two line segment groups among the plurality of line segment groups, the two line segment groups being adjacent in the column direction and included in one memory bank, and a plurality of inter-bank switches configured to control, based on the bank address, electrical connections between two line segments groups respectively included in two memory banks adjacent in the column direction among the plurality of memory banks.

In a method of controlling load of global input-output lines of a semiconductor memory device according to example embodiments, a plurality of global input-output lines to transfer data between a plurality of data pads and a plurality of memory cells are cut into a plurality of line segment groups. Two line segment groups are connected through a plurality of intra-bank switches, where the two line segment groups are included in one memory bank. Switching operations of the plurality of intra-bank switches are controlled based on a row address.

The semiconductor memory device and the method of controlling load of global input-output lines in the semiconductor memory device according to example embodiments may increase operation speed and reduce power consumption by reducing actual driving load of the global input-output lines based on the row address for the access operation with respect to the semiconductor memory device.

BRIEF DESCRIPTION OF THE DRAWINGS

Example embodiments of the present disclosure will be more clearly understood from the following detailed description taken in conjunction with the accompanying drawings.

FIG. 14 is a diagram illustrating a switching operation of intra-bank switches included in a semiconductor device, according to example embodiments.

FIG. 18 is a diagram illustrating operations of intra-bank switches and inter-bank switches included in the semiconductor memory device of FIG. 17, according to example embodiments.

DETAILED DESCRIPTION OF THE EMBODIMENTS

Figure 1:
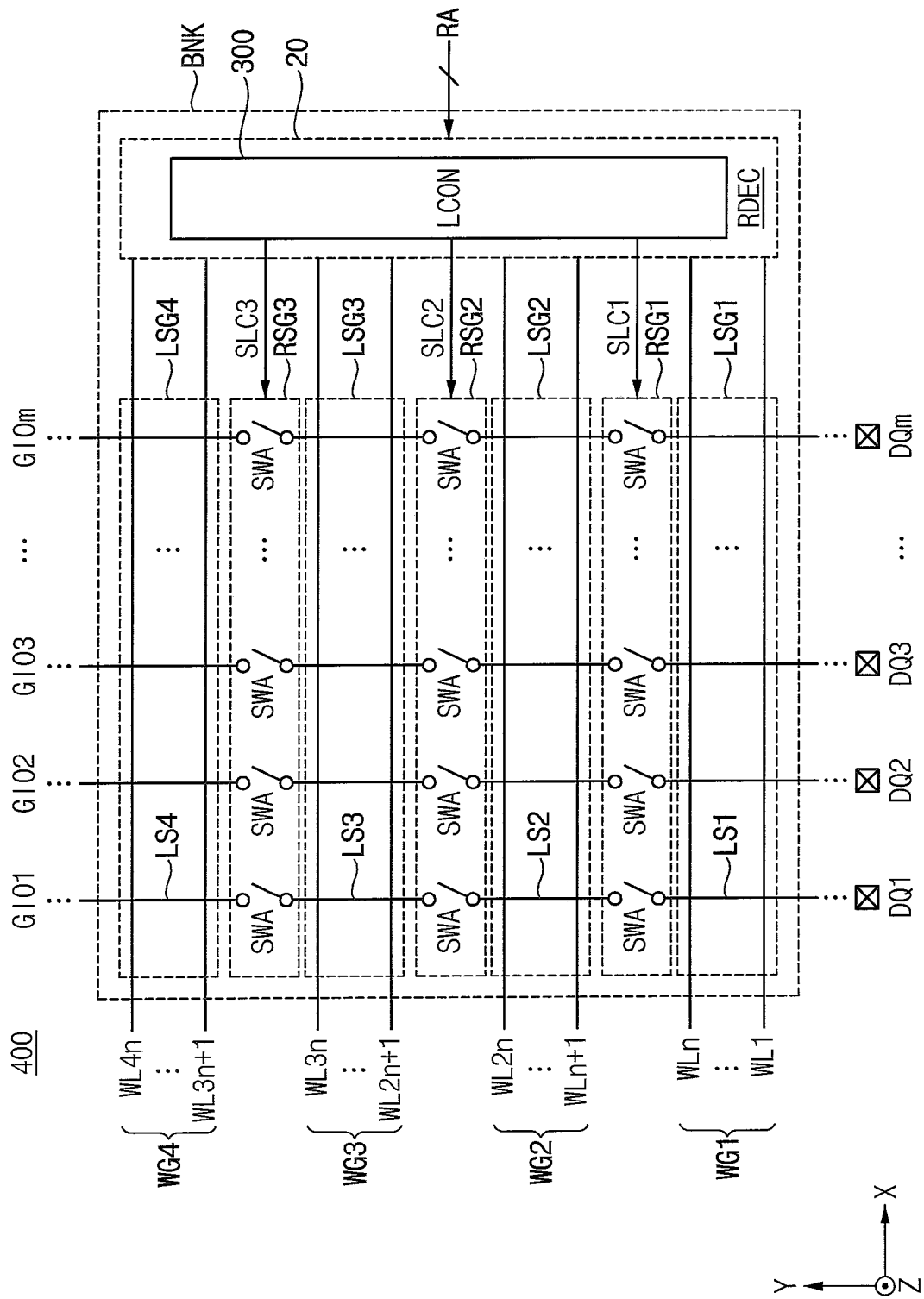
FIG. 1 is a diagram illustrating a semiconductor memory device, according to example embodiments.

Various example embodiments will be described more fully hereinafter with reference to the accompanying drawings, in which some example embodiments are shown. In the drawings, like numerals refer to like elements throughout. The repeated descriptions may be omitted.

Hereinafter, structures of a semiconductor memory device may be described using a first direction X, a second direction Y, and a third direction Z that are perpendicular to one another in a three-dimensional space. The first direction X corresponds to a row direction, the second direction Y corresponds to a column direction and the third direction Z corresponds to a vertical direction.

FIG. 1 is a diagram illustrating a semiconductor memory device, according to example embodiments. A configuration corresponding to one memory bank BNK is illustrated in FIG. 1.

Referring to FIG. 1, a semiconductor memory device 400 may include a plurality of data pads DQ1~DQm, a plurality of wordlines WL1~WL4n, a plurality of global input-output lines GIO1~GIOm, a plurality of intra-bank switches SWA and a row decoder (RDEC) 20. Even though only the elements for describing example embodiments are illustrated in FIG. 1 for convenience of illustration, the semiconductor memory device 400 may further include various other elements as will be described below.

The plurality of data pads DQ1~DQm may be connected to a memory controller as will be described below with reference to FIG. 5. The semiconductor memory device 400 may receive write data for a write operation through the plurality of data pads DQ1~DQm from the memory controller and transmit read data for a read operation through the plurality of data pads DQ1~DQm to the memory controller.

The plurality of wordlines WL1~WL4n may extend in a row direction X and may be arranged in a column direction Y. Among the plurality of wordlines WL1~WLn, one wordline corresponding to a row address RA may be selected as a selection wordline for the read operation or the write operation. Even though not illustrated in FIG. 1 for convenience of illustration, the semiconductor memory device 400 may include a plurality of memory cells connected to the plurality of wordlines WL1~WL4n as will be described below with reference to FIG. 7.

The plurality of global input-output lines GIO1~GIOm may extend in the column direction Y and may be arranged in the row direction X to transfer data between the plurality of data pads DQ1~DQm and the plurality of memory cells. As will be described below, a data path between a data pad and a memory cell may further include a bitline, a local input-output line, a sense amplifier, a reception buffer, an input-output gating circuit, a data input-output buffer, etc. in addition to the global input-output line.

As illustrated in FIG. 1, the plurality of wordlines WL1~WL4n corresponding to the one memory bank BNK may be grouped into a plurality of wordline groups WG1~WG4 such that each wordline group includes wordlines adjacent in the column direction Y.

The plurality of global input-output lines GIO1~GIOm may be cut and grouped into a plurality of line segment groups LSG1~LSG4 respectively corresponding to the plurality of wordline groups WG1~WG4. For example, each of the plurality of global input-output lines GIO1~GIOm may be cut into a plurality of line segments LS1~LS4 respectively corresponding to the plurality of line segment groups LSG1~LSG4.

The plurality of intra-bank switches SWA may control, based on the row address RA, electrical connections between two line segment groups among the plurality of line segment groups LSG1~LSG4 where the two line segment groups are adjacent in the column direction Y and included in one memory bank BNK, that is, the same memory bank.

FIG. 1 illustrates a non-limiting example embodiment that the plurality of wordlines WL1~WL4n corresponding to the one memory bank BNK is grouped into four wordline groups, that is, first through fourth wordline groups WG1~WG4. The number of wordline groups and the number of wordlines in each wordline group may be determined variously according to example embodiments. For example, there may be more than or less than four wordline groups corresponding to each memory bank BNK, and more than or less than four wordlines corresponding to each wordline group.

In some example embodiments, the plurality of line segment groups may include three or more line segment groups corresponding to the one memory bank BNK, and the intra-bank switches SWA corresponding to the one memory bank BNK may be arranged in the row direction R in two or more segment boundaries between the three or more line segment groups to form two or more row switch groups. In this case, the lengths of the three or more line segment groups along the column direction Y may be equal to each other. As described with reference to FIGS. 3 and 4, the intra-bank switches SWA forming each of the two or more row switch groups may be simultaneously turned on or simultaneously turned off based on two or more most significant bits among address bits of the row address RA.

The semiconductor memory device 400 may further include a load control circuit (LCON) 300 that generates one or more intra-bank load control signals SLC1~SLC3 based on the row address RA. In some example embodiments, the load control circuit 300 may be included in the row decoder 20 as illustrated in FIG. 1. In some example embodiments, the load control circuit 300 may be disposed outside of the row decoder 20. The plurality of intra-bank switches SWA may control the electrical connections between the two line segment groups, which are adjacent in the column direction Y in the same memory bank based on each of the intra-bank load control signals SLC1~SLC3.

For example, as illustrated in FIG. 1, the global input-output lines GIO1~GIO4 may include the first through fourth line segment groups LSG1~LSG4 respectively corresponding to the first through fourth wordline groups WG1~WG4 of the one memory bank BNK. The intra-bank switches SWA corresponding to the one memory bank BNK may be arranged in the row direction X in the three segment boundaries between the first through fourth line segment groups LSG1~LSG4 to form three row switch groups, that is, first through third row switch groups RSG1~RSG3.

The lengths of the first through fourth line segment groups LSG1~LSG4 along the column direction Y may be equal to each other. For example, the number of the wordlines corresponding to each of the first through fourth line segment groups LSG1~LSG4 may be equal to each other.

In this case, the load control circuit 300 may generate three intra-bank load control signals, that is, first through third intra-bank load control signals SLC1~SLC3, which may be generated based on two most significant bits among address bits of the row address RA as will be described below with reference to FIG. 4.

The intra-bank switches SWA forming the first row switch group RSG1 may be simultaneously turned on or simultaneously turned off based on the first intra-bank load control signal SLC1. The intra-bank switches SWA forming the second row switch group RSG2 may be simultaneously turned on or simultaneously turned off based on the second intra-bank load control signal SLC2. The intra-bank switches SWA forming the third row switch group RSG3 may be simultaneously turned on or simultaneously turned off based on the third intra-bank load control signal SLC3. The switching operations of the first through third row switch groups RSG1~RSG3 will be further described below with reference to FIG. 4.

Figure 2:
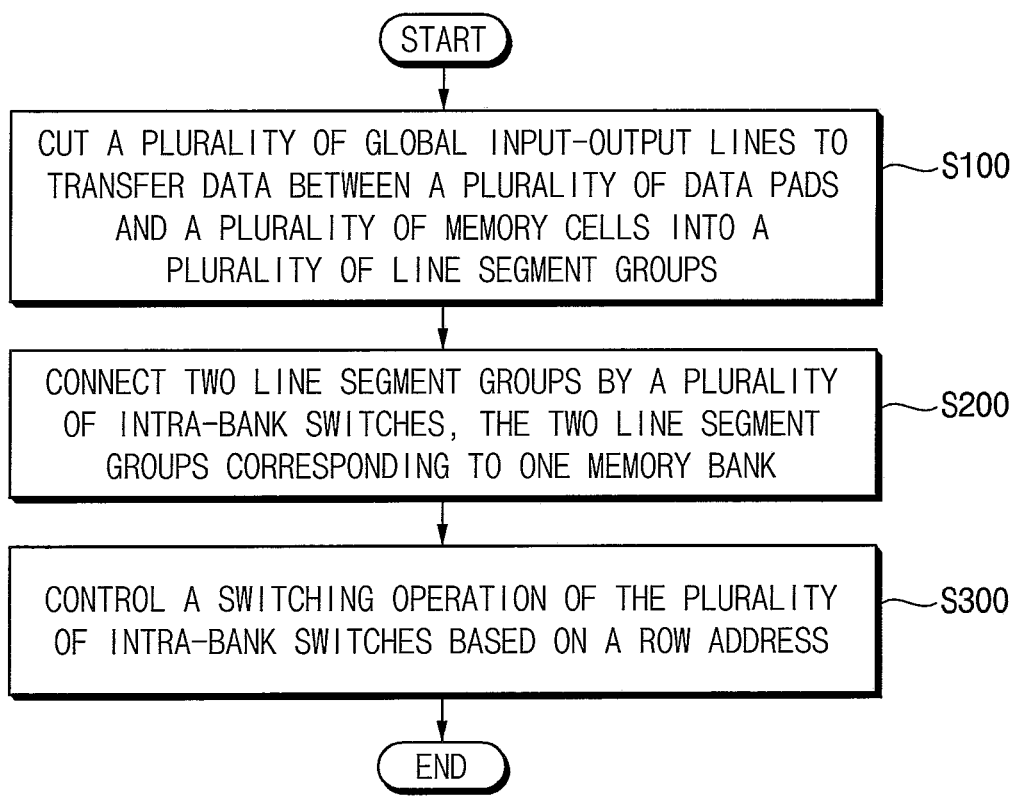
FIG. 2 is a flowchart illustrating a method of controlling load of global input-output lines in a semiconductor memory device, according to example embodiments.

FIG. 2 is a flowchart illustrating a method of controlling load of global input-output lines in a semiconductor memory device, according to example embodiments.

Referring to FIGS. 1 and 2, the plurality of global input-output lines GIO1~GIOm to transfer data between the plurality of data pads DQ1~DQm and the plurality of memory cells may be cut into the plurality of line segment groups LSG1~LSG4 (S100). The number of the line segment groups may be determined variously according to configuration and operational characteristics of a semiconductor memory device.

Two line segment groups corresponding to the one memory bank BNK may be connected through a plurality of intra-bank switches (S200). The two line segment groups are adjacent in the column direction Y and included in the one memory bank BNK. Switching operations of the plurality of intra-bank switches SWA may be controlled based on the row address RA (S300).

In access operations (e.g., a read operation and a write operation) of a semiconductor memory device, such as a dynamic random access memory (DRAM) device, to access memory cells connected to the selection wordline corresponding to the row address RA, a conventional semiconductor memory device drives the entire global input-output line regardless of the position of the selection wordline. The global input-output line may be driven by charging or discharging the global input-output line. The global input-output line may be driven by a global line driver in the write operation and by a local sense amplifier in the read operation. In this case, unnecessary dynamic power may be consumed because the entire global input-output line has to be charged or discharged even though the row address adjacent to the driving circuit is accessed. In addition, to overcome the large load of the global input-output line in a precharge operation, a voltage equalizer for precharge is required to be disposed in the end portion opposite to the end portion in which the global line driver is disposed. Such configuration increases the size and the power consumption of the semiconductor memory device.

According to example embodiments, the dynamic power consumption may be reduced and the speed of data transfer may be increased by controlling the load of the global input-output lines based on the row address.

Figures 3, 4:
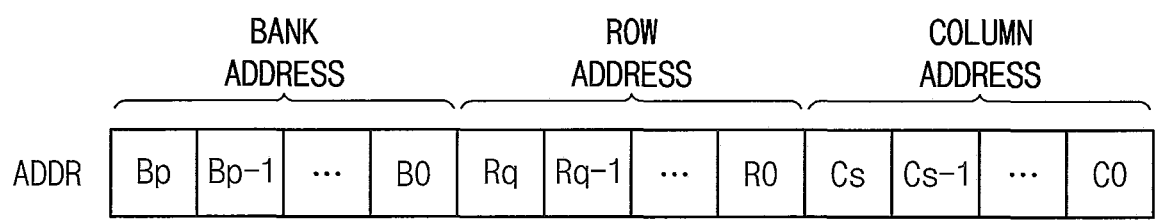
FIG. 3 is a diagram illustrating an example embodiment of an address structure for an access operation with respect to a semiconductor memory device.
FIG. 4 is a diagram illustrating a switching operation of intra-bank switches included in a semiconductor memory device, according to example embodiments.

FIG. 3 is a diagram illustrating an example embodiment of an address structure for an access operation with respect to a semiconductor memory device.

Referring to FIG. 3, an access address ADDR, which is transferred from a memory controller to a semiconductor memory device, may include a bank address, a row address, and a column address.

The bank address may include one or more address bits Bp~B0, the row address may include a plurality of address bits Rq~R0 and the column address may include a plurality of address bits Cs~C0. The bit numbers (p, q, r) of the access address ADDR may be determined variously according to configuration and memory capacity of the semiconductor memory device.

When the semiconductor memory device has a single-bank structure, the access address ADDR may include the row address and the column address without the bank address. In addition, only one memory bank may be connected to each global input-output line even though the semiconductor memory device has a multi-bank structure. In these cases, the bank address may be neglected in association with example embodiment described in this disclosure.

FIG. 4 is a diagram illustrating a switching operation of intra-bank switches included in a semiconductor memory device, according to example embodiments.

Hereinafter, it is assumed that the entire load of each global input-output line is L, the lengths of the first through fourth line segments LS1~LS4 along the column direction Y are equal to each other.

Referring to FIGS. 1 through 4, the load control circuit 300 may generate the first through third intra-bank load control signals SLC1~SLC3 based on the two most significant bits Rq and Rq−1 among the address bits Rq~R0 of the row address RA.

When the two bits (Rq, Rq−1) have values of (0, 0), the selection wordline WLs corresponding to the row address RA may be included in the first wordline group WG1. In this case, the load control circuit 300 may deactivate all of the first through third intra-bank load control signals SLC1~SLC3 to turn off all of the intra-bank switches SWA in the first through third row switch groups RSG1~RSG3. Accordingly, the driving circuit may drive only the first line segment LS1 in the first line segment group LSG1, and the driving load may be L/4.

When the two bits (Rq, Rq−1) have values of (0, 1), the selection wordline WLs corresponding to the row address RA may be included in the second wordline group WG2. In this case, the load control circuit 300 may activate the first intra-bank load control signal SLC1 and deactivate the second and third intra-bank load control signals SLC2 and SLC3 to turn on the intra-bank switches SWA in the first row switch group RSG1 and turn off the intra-bank switches in the second and third row switch groups RSG2 and RSG3. Accordingly, the driving circuit may drive the first and second line segments LS1 and LS2 in the first and second line segment groups LSG1 and LSG2, respectively, and the driving load may be 2L/4=L/2.

When the two bits (Rq, Rq−1) have values of (1, 0), the selection wordline WLs corresponding to the row address RA may be included in the third wordline group WG3. In this case, the load control circuit 300 may activate the first and second intra-bank load control signals SLC1 and SLC2 and deactivate the third intra-bank load control signal SLC3 to turn on the intra-bank switches SWA in the first and second row switch groups RSG1 and RSG2 and turn off the intra-bank switches in the third row switch group RSG3. Accordingly, the driving circuit may drive the first through third line segments LS1~LS3 in the first through third line segment groups LSG1~LSG3, respectively, and the driving load may be 3L/4.

When the two bits (Rq, Rq−1) have values of (1, 1), the selection wordline WLs corresponding to the row address RA may be included in the fourth wordline group WG4. In this case, the load control circuit 300 may activate all of the first through third intra-bank load control signals SLC1~SLC3 to turn on all of the intra-bank switches SWA in the first through third row switch groups RSG1~RSG3. Accordingly, the driving circuit may drive all of the first through fourth line segments LS1~LS4 in the first through fourth line segment groups LSG1~LSG4, respectively, and the driving load may be 4L/4=L.

As a result, the average driving load of the one memory bank BNK may be calculated as (L/4+2*L/4+3*L/4+4*L/4)/4=10*L/16=0.625*L. For example, the driving load of the global input-output line may be reduced by about 37.5%. The power consumption may be reduced and the operation speed may be increased by reducing the driving load of the global input-output line. In general, when each global input-output line is cut into k line segments of the same length and the k line segments are connected using k−1 switches, the average driving load may be calculated as (k+1)*L/2K.

As such, the semiconductor memory device and the method of controlling load of global input-output lines in the semiconductor memory device according to example embodiments may increase operation speed and reduce power consumption by reducing actual driving load of the global input-output lines based on the row address for the access operation with respect to the semiconductor memory device.

Figure 5:
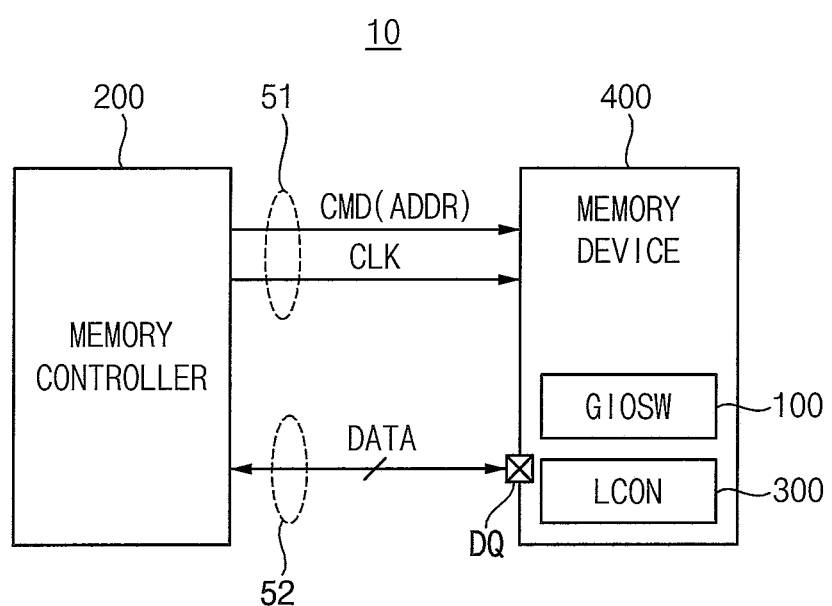
FIG. 5 is a block diagram illustrating a memory system, according to example embodiments.

FIG. 5 is a block diagram illustrating a memory system according to example embodiments.

Referring to FIG. 5, a memory system 10 includes a memory controller 200 and a semiconductor memory device 400. The semiconductor memory device 400 may be referred to as a memory device. The memory controller 200 and the memory device 400 include respective interfaces for mutual communication. The interfaces may be connected through a control bus 51 for transferring a command CMD, an address ADDR, a clock signal CLK, etc. and a data bus 52 for transferring data. According to some standards for memory devices, the address ADDR may be incorporated in the command CMD. The memory controller 200 may generate the command CMD to control the memory device 400 and the data may be written to or read from the memory device 400 under the control of the memory controller 200.

According to example embodiments, the memory device 400 may include a global input-output line switch circuit (GIOSW) 100 and a load control circuit (LCON) 300.

In some example embodiments, the global input-output line switch circuit 100 may include intra-bank switches SWA that are disposed within memory banks as described with reference to FIGS. 1 through 4. In this case, the load control circuit 300 may generate the intra-bank load control signals based on the row address. Based on the intra-bank load control signals, the intra-bank switches SWA may control electrical connections between two line segment groups that are adjacent in the column direction and included in the same memory bank.

In some example embodiments, the global input-output line switch circuit 100 may further include inter-bank switches SWB that are disposed between memory banks as will be described below with reference to FIGS. 17 and 18, in addition to the intra-bank switches SWA. In this case, the load control circuit 300 may generate intra-bank load control signals based on the row address and the bank address and generate inter-bank control signals based on the bank address. The intra-bank switches SWA may control the electrical connections between the two line segment groups adjacent in the column direction Y in the same bank based on the intra-bank load control signal, and the inter-bank switches SWB may control the electrical connections between two line segment groups respectively included in the two memory banks adjacent in the column direction Y based on the inter-bank load control signal.

Figure 6:
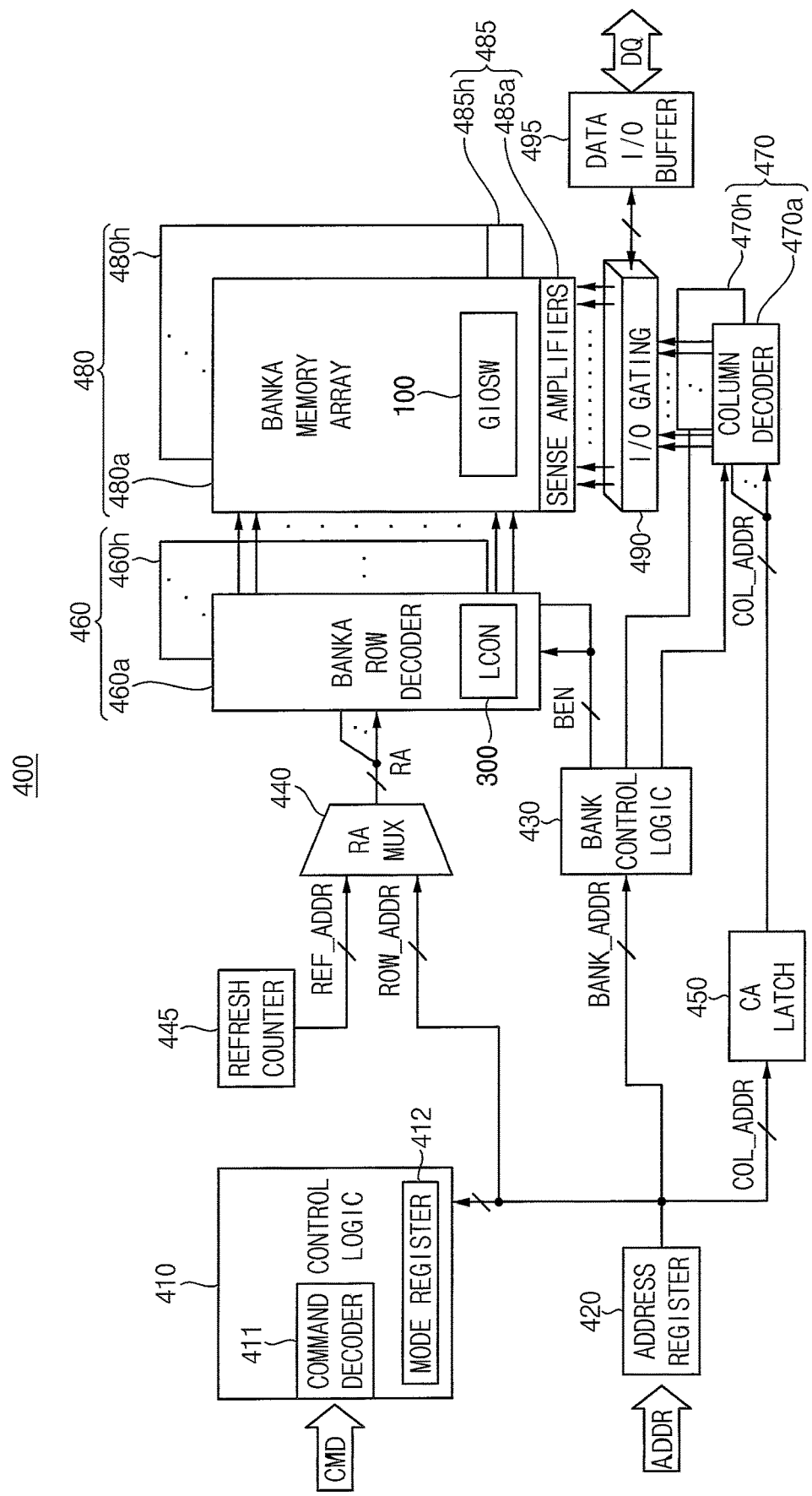
FIG. 6 is a block diagram illustrating a semiconductor memory device, according to example embodiments.

FIG. 6 is a block diagram illustrating a semiconductor memory device, according to example embodiments.

Referring to FIG. 6, a semiconductor memory device 400 (or, alternatively, the memory device) may include a control logic 410, an address register 420, a bank control logic 430, a row address multiplexer 440, a column address latch 450, a row decoder 460, a column decoder 470, a memory cell array 480, a sense amplifier unit 485, an input-output (I/O) gating circuit 490, a data input-output (I/O) buffer 495, and a refresh counter 445.

The memory cell array 480 may include a plurality of bank arrays 480a~480h. The row decoder 460 may include a plurality of bank row decoders 460a~460h respectively coupled to the bank arrays 480a~480h, the column decoder 470 may include a plurality of bank column decoders 470a~470h respectively coupled to the bank arrays 480a~480h, and the sense amplifier unit 485 may include a plurality of bank sense amplifiers 485a~485h respectively coupled to the bank arrays 480a~480h. Each of the bank arrays 480a~480h may include a global input-output line switch circuit GIOSW 100 as described above, and each of the bank row decoders 460a~460h may include a load control circuit LCON 300 as described above.

The address register 420 may receive an address ADDR including a bank address BANK_ADDR, a row address ROW_ADDR and a column address COL_ADDR from a memory controller (not shown). The address register 420 may provide the received bank address BANK_ADDR to the bank control logic 430, may provide the received row address ROW_ADDR to the row address multiplexer 440, and may provide the received column address COL_ADDR to the column address latch 450.

The bank control logic 430 may generate bank control signals in response to the bank address BANK_ADDR. The bank control signals may include bank enable signals BEN to activate a selection memory bank corresponding to the bank address BANK_ADDR. One of the bank row decoders 460a~460h corresponding to the bank address BANK_ADDR may be activated in response to the bank control signals, and one of the bank column decoders 470a~470h corresponding to the bank address BANK_ADDR may be activated in response to the bank control signals.

The row address multiplexer 440 may receive the row address ROW_ADDR from the address register 420, and may receive a refresh row address REF ADDR from the refresh counter 445. The row address multiplexer 440 may selectively output the row address ROW_ADDR or the refresh row address REF ADDR as a row address RA. The row address RA that is output from the row address multiplexer 440 may be applied to the bank row decoders 460a~460h.

The activated one of the bank row decoders 460a~460h may decode the row address RA that is output from the row address multiplexer 440, and may activate a word-line corresponding to the row address RA. For example, the activated bank row decoder may apply a word-line driving voltage to the word-line corresponding to the row address RA.

The column address latch 450 may receive the column address COL_ADDR from the address register 420, and may temporarily store the received column address COL_ADDR. In some embodiments, in a burst mode, the column address latch 450 may generate column addresses that increment from the received column address COL_ADDR. The column address latch 450 may apply the temporarily stored or generated column address to the bank column decoders 470a~470h.

The activated one of the bank column decoders 470a~470h may decode the column address COL_ADDR that is output from the column address latch 450, and may control the input-output I/O gating circuit 490 in order to output data corresponding to the column address COL_ADDR.

The I/O gating circuit 490 may include a circuitry for gating input/output data. The I/O gating circuit 490 may further include read data latches for storing data that is output from the bank arrays 480a~480h, and write drivers for writing data to the bank arrays 480a~480h.

Data to be read from one bank array of the bank arrays 480a~480h may be sensed by the sense amplifier unit 485 coupled to the one bank array from which the data is to be read, and may be stored in the read data latches. The data stored in the read data latches may be provided to the memory controller via the data I/O buffer 495. Data DQ to be written in one bank array of the bank arrays 480a~480h may be provided to the data I/O buffer 495 from the memory controller. The write driver may write the data DQ in one bank array of the bank arrays 480a~480h.

The control logic 410 may control operations of the memory device 400. For example, the control logic 410 may generate control signals for the memory device 400 in order to perform a write operation or a read operation. The control logic 410 may include a command decoder 411 that decodes a command CMD received from the memory controller and a mode register set 412 that sets an operation mode of the memory device 400.

For example, the command decoder 411 may generate the control signals corresponding to the command CMD by decoding a write enable signal, a row address strobe signal, a column address strobe signal, a chip selection signal, etc.

Figure 7:
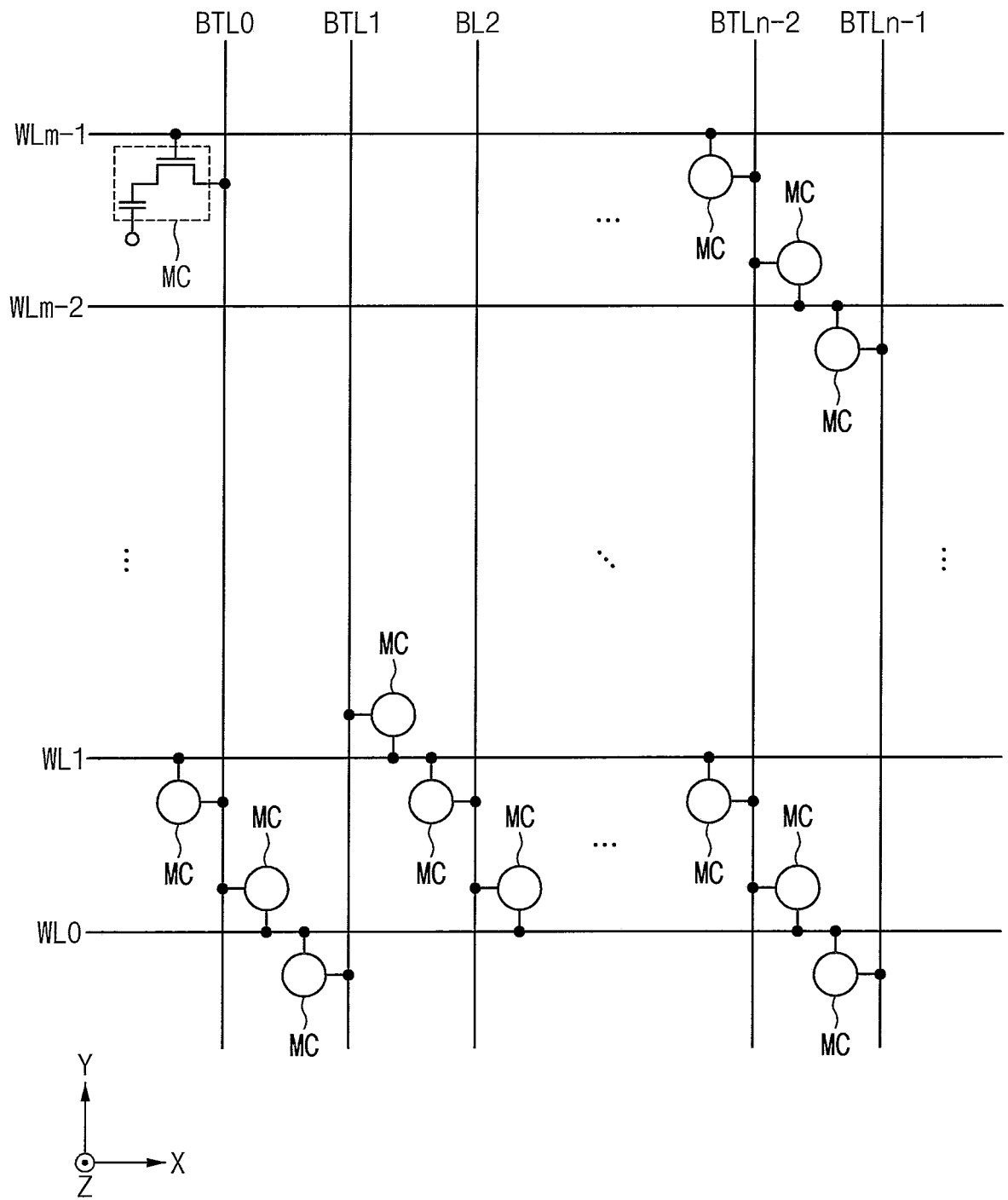
FIG. 7 is a diagram illustrating a bank array included in the semiconductor memory device of FIG. 6, according to example embodiments.

FIG. 7 is a diagram illustrating a bank array included in the semiconductor memory device of FIG. 6. The first bank arrays 480a may be representative of the first through eighth bank arrays 480a to 480h.

Referring to FIG. 7, the first bank array 480a may include a plurality of wordlines WL0~WLm-1, where m is an even integer equal to or greater than two, a plurality of bitlines BTL0~BTLn-1, where n is an even integer equal to or greater than two, and a plurality of memory cells MC disposed at intersections between the wordlines WL0~WLm-1 and the bitlines BTL0~BTLn-1.

In some example embodiments, each of the memory cells MC may include DRAM cell. The arrangement of the plurality of memory cells MC may differ based on whether a memory cell MC is coupled to an even wordline (for example, wordline WL0) or to an odd wordline (for example, wordline WL1). For example, a bitline coupled to adjacent memory cells MC may be selected based on whether a wordline selected by an access address is an even wordline or an odd wordline.

Figure 8:
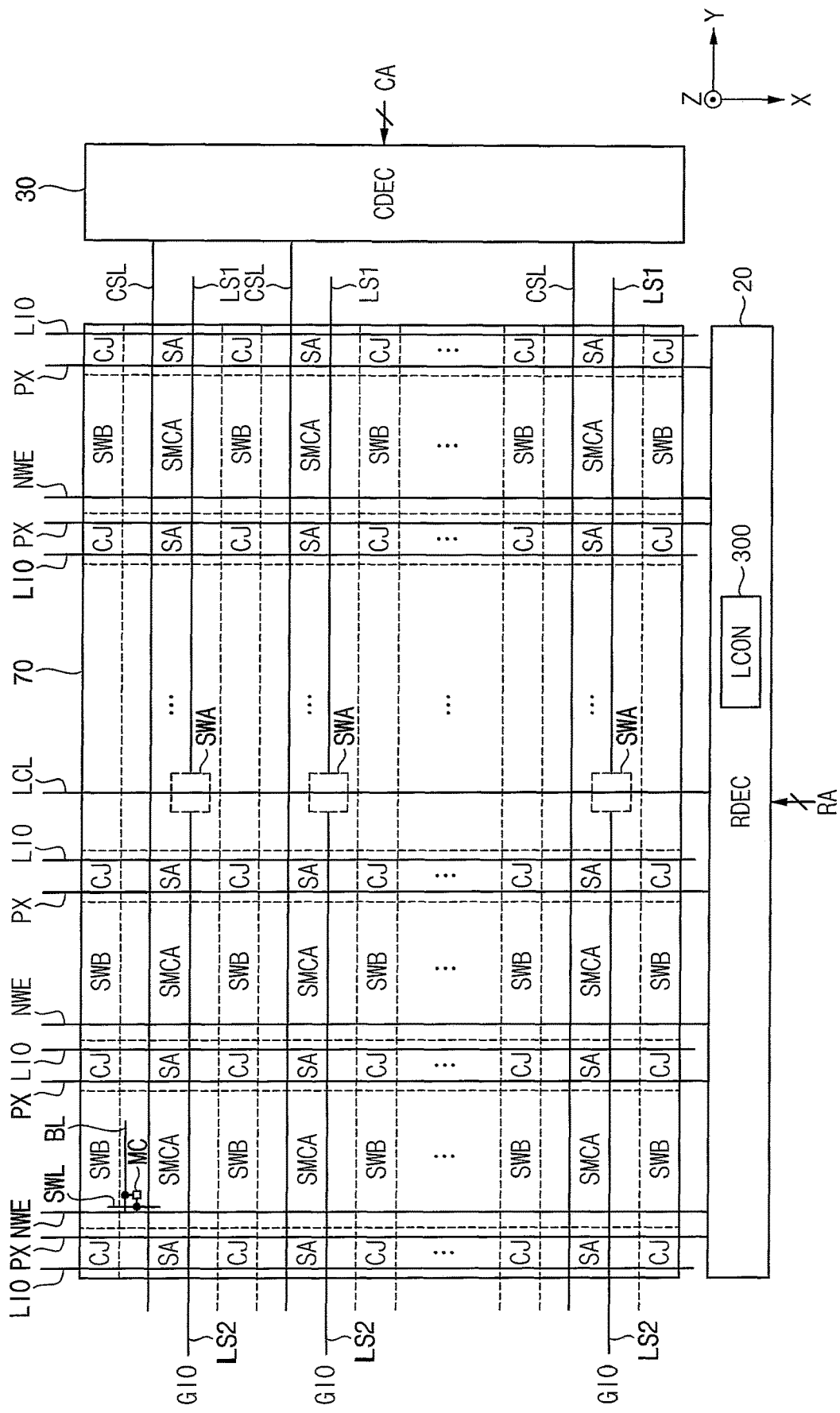
FIG. 8 is a diagram illustrating an example embodiment of a layout of the semiconductor memory device of FIG. 6, according to example embodiments.

FIG. 8 is a diagram illustrating an example embodiment of a layout of the semiconductor memory device of FIG. 6. FIG. 8 illustrates a configuration corresponding to one memory bank.

FIG. 8 illustrates a memory cell array region 70, a row decoder (RDEC) 20, and a column decoder (CDEC) 30. Other components of the semiconductor memory device of FIG. 6 are omitted for convenience of illustration. The memory cell array region 70, the row decoder 20, and the column decoder 30 illustrated in FIG. 8 respectively correspond to the memory cell array 480, the column decoder 470, and the row decoder 460 illustrated in FIG. 6. The memory cell array region 70 may include a dual wordline structure including a main wordline NWE and a plurality of sub wordlines SWL, conjunction regions CJ, sub wordline driver regions SWB, sense amplifier regions SA, and sub memory cell array regions SMCA. Word selection signal lines PX, main wordlines NWE, sub wordlines SWL, column selection signal lines CSL, local input-output lines LIO and global input-output lines GIO may be formed in an upper portion of the memory cell array region 70. The power lines are omitted in FIG. 8 for convenience of illustration.

In the memory cell array region 70, the conjunction regions CJ, the sub wordline driver regions SWB, the sense amplifier regions SA and the sub memory cell array regions SMCA are disposed repeatedly in the row direction X and the column direction Y. The memory cells MC are formed in the sub memory cell array regions SMCA and connected to the sub wordlines SWL and the bitlines BL. The data may be written to or read from the memory cells MC in response to the signals transferred through the word selection signal lines PX, the main wordlines NWE and the column selection signal lines CSL.

The column decoder 30 generates signals on column select signal lines CSL to select one or more columns of the array for reading or writing according to a supplied column address CA. The row decoder 20 decodes the row address RA to generate signals for selecting one of the main wordlines NWE and signals for selecting one of the wordline selection lines PX.

The main wordlines NWE extend in the row direction X on the sub wordline driver regions SWB and the sub memory cell array regions SMCA, and the word selection signal lines PX and the local input-output lines LIO extend in the row direction X on the conjunction regions CJ and the sense amplifier regions SA. The column selection signal lines CSL and the global input-output lines GIO extend in the column direction Y on the sense amplifier regions SA and the sub memory cell array regions SMCA.

According to example embodiments, each global input-output line GIO may be cut into two or more line segments. FIG. 8 illustrates an example embodiment that the global input-output line GIO is cut into a first line segment LS1 and a second line segment LS2.

The first line segment LS1 and the second line segment LS2 are connected through the intra-bank switch SWA, and the electrical connection between the first line segment LS1 and the second line segment LS2 may be controlled through the switching operation (turning on or off) of the intra-bank switch SWA.

The load control circuit (LCON) 300 may generate the intra-bank load control signal based on the row address RA. The intra-bank switches SWA may be arranged in the row direction X to form a row switch group. The intra-bank load control signal may be provided commonly to the intra-bank switches SWA of the row switch group through a load control line LCL extending in the row direction X. Accordingly, the intra-bank switches SWA forming the row switch group may be simultaneously turned on or simultaneously turned off based on the intra-bank load control signal.

Figure 9:
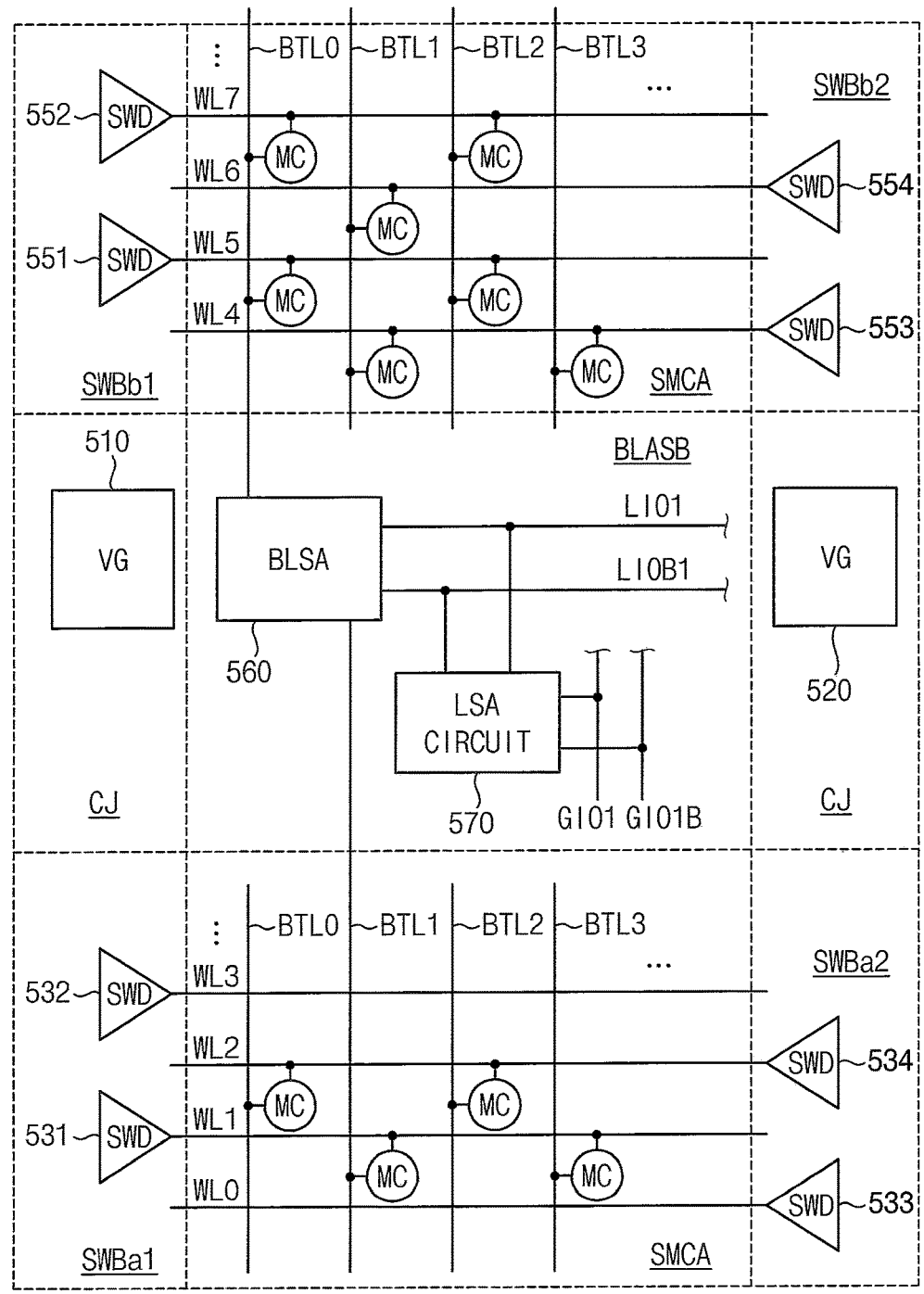
FIG. 9 is a diagram illustrating a further detailed layout of the semiconductor memory device of FIG. 8.

FIG. 9 is a diagram illustrating a further detailed layout of the semiconductor memory device of FIG. 8.

Referring to FIGS. 8 and 9, the two sub memory cell array regions SMCA, the bitline sense amplifier regions BLSAB, the four sub wordline driver regions SWBa1, SWBa2, SWBb1, and SWBb2, and the two conjunction regions CJ may be disposed in the portion of the first bank array 480a.

The sub memory cell array regions SMCA may include a plurality of wordlines WL0~WL7 extending in the row direction X, a plurality of bitlines BTL0~BTL3 extending in the column direction Y, and the memory cells MC disposed at the intersections of the wordlines WL0~WL3 and the bitlines BTL0~BTL3.

The sub wordline driver regions SWBa1 and SWBa2 may include a plurality of sub wordline drivers 531, 532, 533, and 534 that may respectively drive the wordlines WL0~WL3. The sub wordline driver regions SWBb1 and SWBb2 may include a plurality of sub wordline drivers 551, 552, 553, and 554 that may respectively drive the wordlines WL4~WL7.

The bitline sense amplifier regions BLSAB may include bitline sense amplifiers 560 coupled to the bitline BTL0 in the upper sub memory cell array regions SMCA and the bitline BTL1 in the lower sub memory cell array regions SMCA, and a local sense amplifier circuit 570. The bitline sense amplifier 560 may sense and amplify a voltage difference between the bitlines BTL0 and BTL1 to provide the amplified voltage difference to a local I/O line pair LIO1 and LIOB1. The local sense amplifier circuit 570 may sense and amplify a voltage difference between the local I/O line pair LIO1 and LIOB1 to provide the amplified voltage difference to a global I/O line pair GIO1 and GIOB1.

As illustrated in FIG. 9, the conjunction regions CJ are disposed adjacent to the bitline sense amplifier regions BLSAB, the sub wordline driver regions SWBa1, SWBb1, SWBa2, and SWBb2, and the sub memory cell array regions SMCA. For example, voltage generators VG 510 and 520 may be disposed in the conjunction regions CJ.

Figure 10:
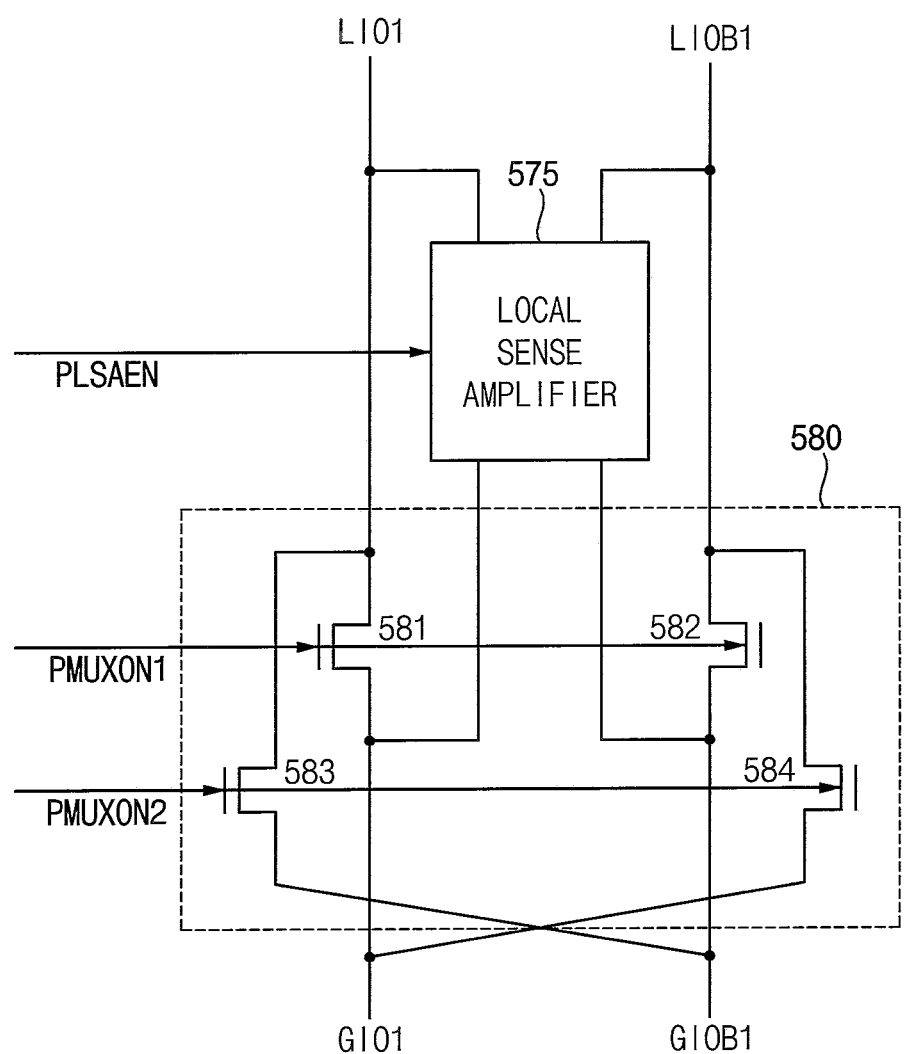
FIG. 10 is a diagram illustrating an example embodiment of a local sense amplifier included in the semiconductor memory device of FIG. 9, according to example embodiments.

FIG. 10 is a diagram illustrating an example embodiment of a local sense amplifier include in the semiconductor memory device of FIG. 9.

Referring to FIG. 10, the local sense amplifier circuit 570 may include a local sense amplifier 575 and a local I/O line controller 580.

The local sense amplifier 575 may amplify a voltage difference between the local I/O line pair LIO1 and LIOB1 in response to a local sense enable signal PLSAEN and may provide the amplified voltage difference to a global I/O line pair GIO1 and GIOB1. The local I/O line controller 580 may include first through fourth NMOS transistors 581, 582, 583, and 584, and may provide electrical connections between the local I/O line pair LIO1 and LIOB1 and the global I/O line pair GIO1 and GIOB1 in response to a first connection control signal PMUXON1 and a second connection control signal PMUXON2.

For example, when each of the local sense enable signal PLSAEN, the first connection control signal PMUXON1, and the second connection control signal PMUXON2 is a low level, the local sense amplifier 575 may be deactivated and the local I/O line controller 580 may cut off a connection between the local I/O line pair LIO1 and LIOB1 and the global I/O line pair GIO1 and GIOB1.

For example, when each of the first local sense enable signal PLSAEN, the first connection control signal PMUXON1, and the second connection control signal PMUXON2 is a high level, the local sense amplifier 575 may be activated and the local I/O line controller 580 may provide a connection between the local I/O line pair LIO1 and LIOB1 and the global I/O line pair GIO1 and GIOB1.

Figure 11:
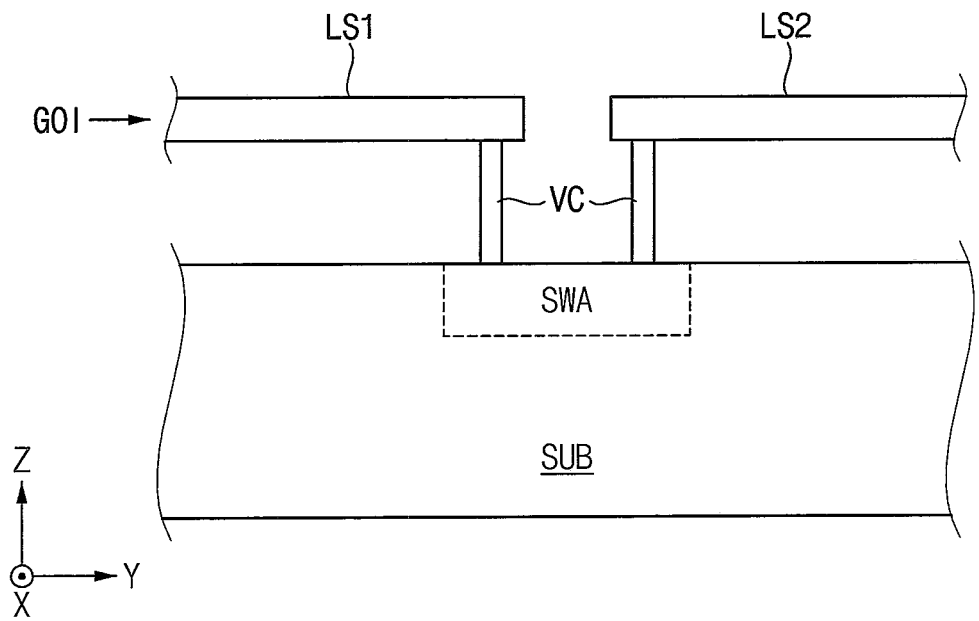
FIG. 11 is a diagram illustrating a vertical structure of a global input-output line included in a semiconductor memory device, according to example embodiments.

FIG. 11 is a diagram illustrating a vertical structure of a global input-output line included in a semiconductor memory device, according to example embodiments.

Referring to FIG. 11, a global input-output line GIO extending in the column direction may be formed in a conduction layer above a semiconductor substrate SUB. As described above, the global input-output line GIO may be cut into a first line segment LS1 and a second line segment within a memory bank.

An intra-bank switch SWA to connect the first line segment LS1 and the second line segment LS2 may be formed in the semiconductor substrate SUB. The facing end portions of the first line segment LS1 and the second line segment LS2 may be connected to the intra-bank switch SWA through vertical contacts VC extending in the vertical direction Z.

Figure 12:
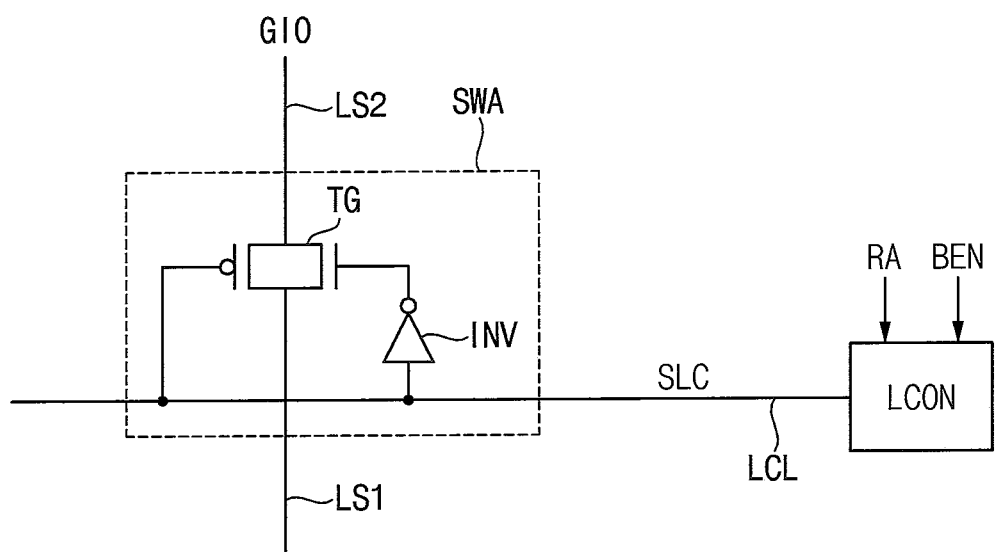
FIG. 12 is a diagram illustrating an intra-bank switch included in a semiconductor device, according to example embodiments.

FIG. 12 is a diagram illustrating an intra-bank switch included in a semiconductor device, according to example embodiments.

Referring to FIG. 12, each intra-bank switch SWA may be implemented with a transmission gate TG. An intra-bank load control signal SLC generated from the load control circuit LCON may be provided to the intra-bank switch SWA through a load control line LCL. As described above, the load control circuit LCON may generate the intra-bank load control signal SLC based on the row address RA. In some example embodiments, the load control circuit LCON may generate the intra-bank load control signal SLC based on the bank enable signal BEN in addition to the row address RA, where the bank enable signal BEN is generated based on the bank address as described with reference to FIG. 6.

In some example embodiments, as illustrated in FIG. 12, the intra-bank switch SWA may include a transmission gate TG and an inverter INV. The intra-bank load control signal SLC may be applied to a PMOS control terminal of the transmission gate TG, and an output of the inverter INV, that is, an inversion signal of the intra-bank load control signal SLC may be applied to an NMOS control terminal of the transmission gate TG. In this case, the first line segment LS1 and the second line segment LS2 of the global input-output line GIO may be electrically connected to each other when the intra-bank load control signal SLC has a logic low level. In contrast, the first line segment LS1 and the second line segment LS2 of the global input-output line GIO may be electrically separated from each other when the intra-bank load control signal SLC has a logic high level.

In some example embodiments, termination driving scheme may be adopted for high-speed driving of the global input-output line GIO. For example, the global input-output line GIO may be terminated with a power supply voltage in the read operation and terminated with a ground voltage in a write operation. In such driving scheme, the intra-bank switch SWA may have better operation characteristics by implementing the intra-bank switch SWA with the transmission gate than with an NMOS transistor or a PMOS transistor.

Figure 13:
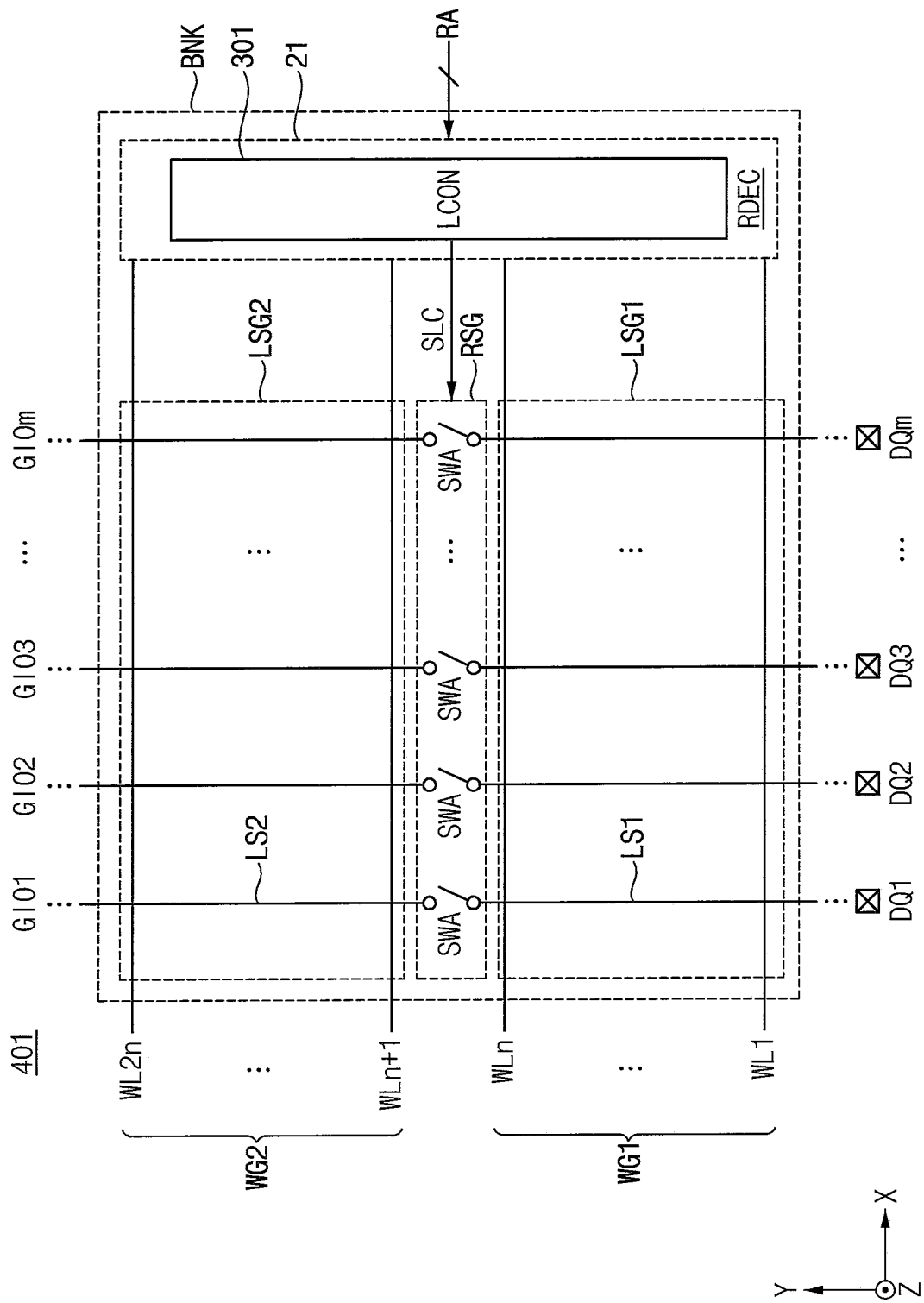
FIG. 13 is a diagram illustrating a semiconductor memory device, according to example embodiments.

FIG. 13 is a diagram illustrating a semiconductor memory device, according to example embodiments. A configuration corresponding to one memory bank BNK is illustrated in FIG. 13.

Referring to FIG. 13, a semiconductor memory device 401 may include a plurality of data pads DQ1~DQm, a plurality of wordlines WL1~WL2n, a plurality of global input-output lines GIO1~GIOm, a plurality of intra-bank switches SWA and a row decoder RDEC 21. Even though only the elements for describing example embodiments are illustrated in FIG. 13 for convenience of illustration, the semiconductor memory device 401 may further include various other elements as described above.

The plurality of data pads DQ1~DQm may be connected to a memory controller as described above with reference to FIG. 5. The semiconductor memory device 401 may receive write data for a write operation through the plurality of data pads DQ1~DQm from the memory controller and transmit read data for a read operation through the plurality of data pads DQ1~DQm to the memory controller.

The plurality of wordlines WL1~WL2n may extend in a row direction X and may be arranged in a column direction Y. Among the plurality of wordlines WL1~WLn, one wordline corresponding to a row address RA may be selected as a selection wordline for the read operation or the write operation. Even though not illustrated in FIG. 13 for convenience of illustration, a plurality of memory cells may be connected to the plurality of wordlines WL1~WL2n.

The plurality of global input-output lines GIO1~GIOm may extend in the column direction Y and may be arranged in the row direction X to transfer data between the plurality of data pads DQ1~DQm and the plurality of memory cells. As will be described below, a data path between a data pad and a memory cell may further include a bitline, a local input-output line, a sense amplifier, a reception buffer, an input-output gating circuit, a data input-output buffer, etc. in addition to the global input-output line.

As illustrated in FIG. 13, the plurality of wordlines WL1~WL4n corresponding to the one memory bank BNK may be grouped into a first wordline group WG1 and a second wordline group WG2 such that each wordline group includes wordlines adjacent in the column direction Y.

The plurality of global input-output lines GIO1~GIOm may be cut and grouped into a first line segment group LSG1 and a second line segment group LSG2 respectively corresponding to the first wordline group WG1 and the second wordline group WG2. For example, each of the plurality of global input-output lines GIO1~GIOm may be cut into a first line segment LS1 and a second line segment LS2 respectively corresponding to the first line segment group LSG1 and the second line segment group LSG2.

The plurality of intra-bank switches SWA may control, based on the row address RA, electrical connections between two the first and second line segment groups LSG1 and LSG2. The plurality of intra-bank switches SWA corresponding to the one memory bank BNK may be arranged in the segment boundary between the first and second line segment groups LSG1 and LSG2 to form row switch group RSG.

The lengths of the first and second line segment groups LSG1 and LSG2 along the column direction Y may be equal to each other. For example, the number of the wordlines corresponding to each of the first and second line segment groups LSG1 and LSG2 may be equal to each other.

In this case, the load control circuit 301 may generate an intra-bank load control signal SLC based on a most significant bit among address bits of the row address RA as will be described below with reference to FIG. 14.

Figure 14:
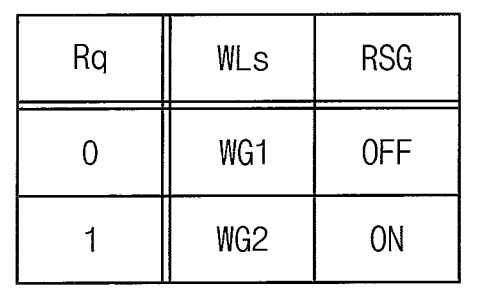

FIG. 14 is a diagram illustrating a switching operation of intra-bank switches included in a semiconductor device, according to example embodiments.

Hereinafter, it is assumed that the entire load of each global input-output line is L, and the lengths of the first and second line segments LS1 and LS2 along the column direction Y are equal to each other.

Referring to FIGS. 3, 13, and 14, the load control circuit 301 may generate the intra-bank load control signal SLC based on the most significant bit Rq among the address bits Rq~R0 of the row address RA.

When the most significant bit Rq has a value of 0, the selection wordline WL corresponding to the row address RA may be included in the first wordline group WG1. In this case, the load control circuit 301 may deactivate the intra-bank load control signal SLC1 to turn off the intra-bank switches SWA in the row switch group RSG. Accordingly, the driving circuit may drive only the first line segment LS1 in the first line segment group LSG1, and the driving load may be L/2.

When the most significant bit Rq has a value of 1, the selection wordline WL corresponding to the row address RA may be included in the second wordline group WG2. In this case, the load control circuit 301 may activate the intra-bank load control signal SLC to turn on the intra-bank switches SWA in the row switch group RSG. Accordingly, the driving circuit may drive both of the first and second line segments LS1 and LS2 in the first and second line segment groups LSG1 and LSG2, and the driving load may be 2L/2=L.

As a result, the average driving load of the one memory bank BNK may be calculated as (L/2+2*L/2)/2=0.75*L. For example, the driving load of the global input-output line may be reduced by about 75%. The power consumption may be reduced and the operation speed may be increased by reducing the driving load of the global input-output line.

Figure 15:
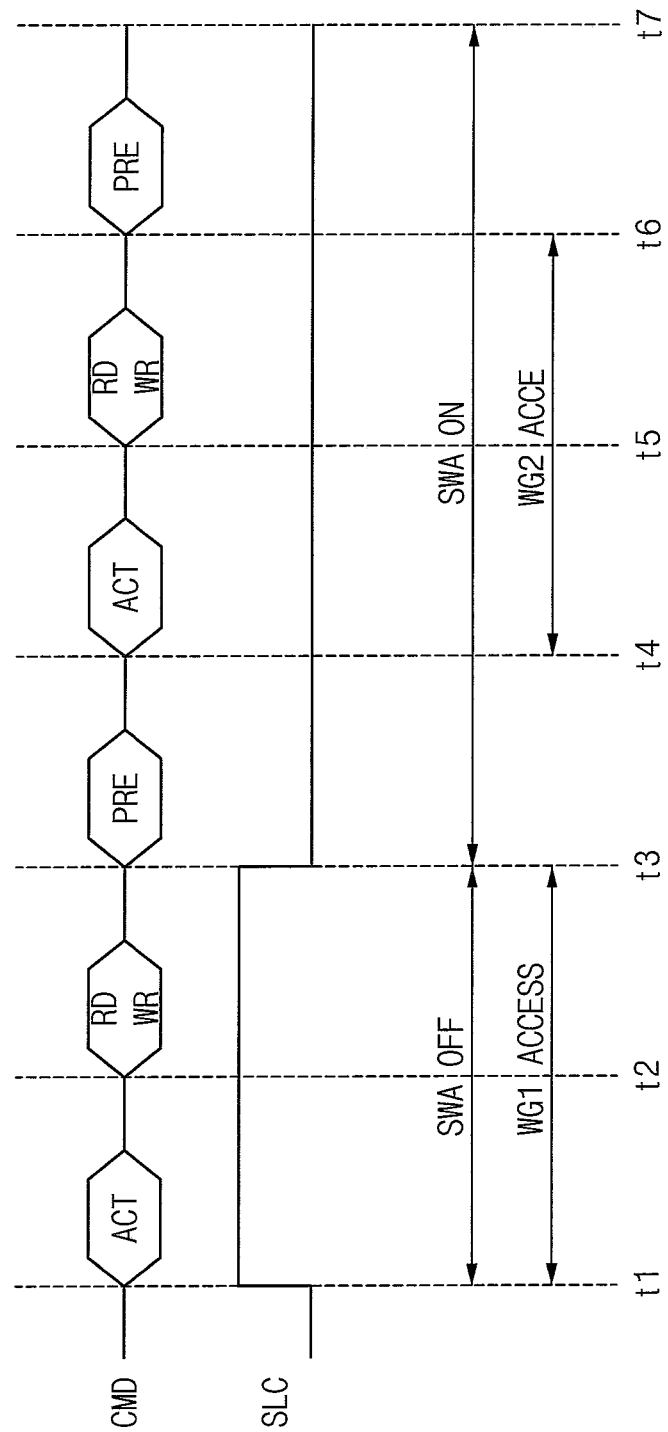
FIG. 15 is a diagram illustrating an access operation with respect to the semiconductor memory device of FIG. 13, according to example embodiments.

FIG. 15 is a diagram illustrating an access operation with respect to the semiconductor memory device of FIG. 13.

FIG. 15 illustrates commands CMD that are transferred from a memory controller at time points t1~t6.

A first access operation may be performed during time interval t1~t3 based on an active command (ACT) and a read command RD (or a write command WR), and a global input-output line may be precharged during time interval t3~t4 based on a precharge command PRE for a next access operation.

A second access operation may be performed during time interval t4~t6 based on another active command (ACT) and another read command RD (or another write command WR), and the global input-output line may be precharged during time interval t6~t7 based on another precharge command PRE for a next access operation.

For example, the first access operation may be the read or write operation with respect to the first wordline group WG1 and the second access operation may be the read or write operation with respect to the second wordline group WG2.

During time interval t1~t2, the intra-bank load control signal SLC may be deactivated, for example, in a logic high level, to turn off the intra-bank switches SWA of the row switch group RSW, and the first line segment LS1 and the second line segment LS2 may be electrically separated from each other. For example, the intra-bank switches SWA may be simultaneously turned off, and memory cells connected to the first wordline group WG1 may be accessed. Accordingly, the driving circuit may drive only the first line segment LS1 in the first line segment group LSG1.

During time interval t4~t6, the intra-bank load control signal SLC may be activated, for example, in a logic low level, to turn on the intra-bank switches SWA of the row switch group RSW, and the first line segment LS1 and the second line segment LS2 may be electrically connected to each other. For example, the intra-bank switches SWA may be simultaneously turned on, and memory cells connected to the first wordline group WG2 may be accessed. Accordingly, the driving circuit may drive both of the first and second line segments LS1 and LS2 in the first and second line segment groups LSG1 and LSG2.

During time intervals t3~t4 and t6~t7, the intra-bank switches SWA are turned on regardless of the row address RA to precharge the entire segments of the global input-output lines GIO1~GIOm. The precharge of the second line segment group LSG2 may not be required because the intra-bank switches SWA maintain the turn-off state until time point t3, and thus power consumption for the precharge of the global input-output lines may be reduced.

Figure 16:
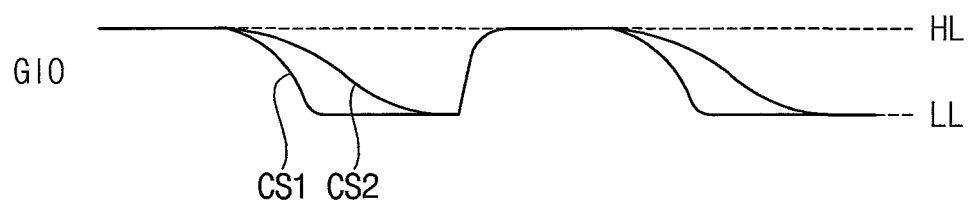
FIG. 16 is a diagram illustrating load reduction effect of a semiconductor device, according to example embodiments.

FIG. 16 is a diagram illustrating load reduction effect of a semiconductor device, according to example embodiments.

FIG. 16 illustrates an example that a voltage of a global input-output line GIO swings between a high level HL and a low level LL depending on values of transferred data. A first case CS1 corresponds to an access operation with respect to the first wordline group WG1 in FIG. 13, and a second case CS2 corresponds to an access operation with respect to the second wordline group WG2 in FIG. 13.

As described above, the first and second line segments LS1 and LS2 of the global input-output line GIO may be electrically separated in the first case CS1, and the voltage of the global input-output line GIO may transition rapidly in comparison with the second case CS2. Accordingly, through increase of the slew rate, the operation speed of the semiconductor memory device may be increased and the power consumption may be reduced.

Figure 17:
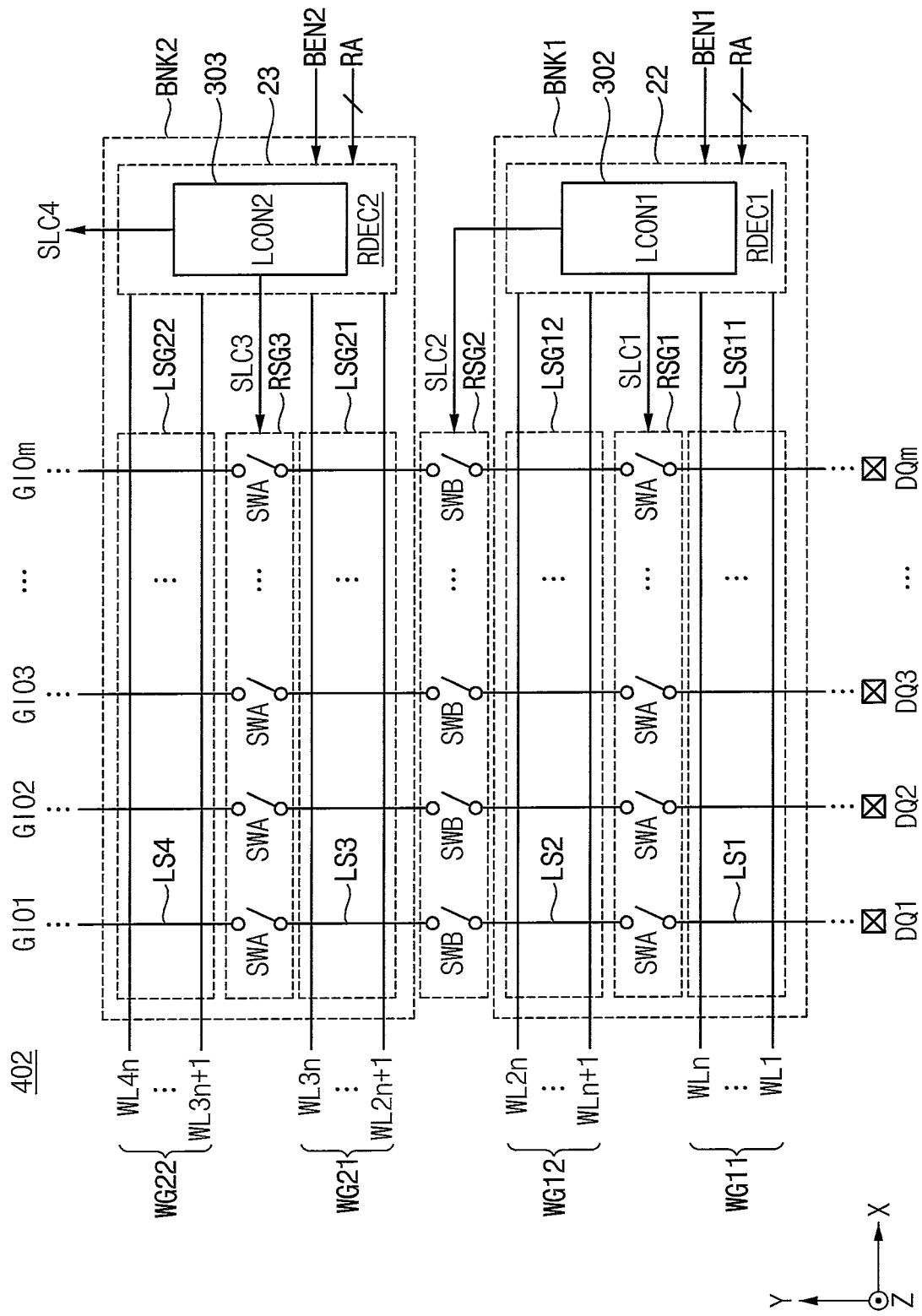
FIG. 17 is a diagram illustrating a semiconductor device, according to example embodiments.

FIG. 17 is a diagram illustrating a semiconductor device, according to example embodiments.

FIG. 17 illustrates an example embodiment of a semiconductor memory device 402 that includes a plurality of memory banks, for example, a first memory bank BNK1 and a second memory bank BNK2, which are commonly connected to a plurality of global input-output lines GIO1~GIOm.

Referring to FIG. 17, the semiconductor memory device 402 may include a plurality of data pads DQ1~DQm, a plurality of wordlines WL1~WL4n, a plurality of global input-output lines GIO1~GIOm, a plurality of intra-bank switches SWA, a plurality of inter-bank switches SWB, a first row decoder RDEC1 22 and a second row decoder RDEC2 23. Even though only the elements for describing example embodiments are illustrated in FIG. 17 for convenience of illustration, the semiconductor memory device 402 may further include various other elements as described above.

The plurality of data pads DQ1~DQm may be connected to a memory controller as described above with reference to FIG. 5. The semiconductor memory device 402 may receive write data for a write operation through the plurality of data pads DQ1~DQm from the memory controller and transmit read data for a read operation through the plurality of data pads DQ1~DQm to the memory controller.

The plurality of wordlines WL1~WL4n may extend in a row direction X and may be arranged in a column direction Y. Among the plurality of wordlines WL1~WLn, one wordline corresponding to a row address RA may be selected as a selection wordline for the read operation or the write operation. As described above, one of first and second bank enable signal BEN1 and BEN2 may be activated based on a bank address, and one memory bank may be determined as a selection memory bank among the first and second memory banks BNK1 and BNK2. Even though not illustrated in FIG. 17 for convenience of illustration, the semiconductor memory device 402 may include a plurality of memory cells connected to the plurality of wordlines WL1~WL4n as described above with reference to FIG. 7.

The plurality of global input-output lines GIO1~GIOm may extend in the column direction Y and may be arranged in the row direction X to transfer data between the plurality of data pads DQ1~DQm and the plurality of memory cells. As will be described below, a data path between a data pad and a memory cell may further include a bitline, a local input-output line, a sense amplifier, a reception buffer, an input-output gating circuit, a data input-output buffer, etc. in addition to the global input-output line.

As illustrated in FIG. 17, the wordlines WL1~WL2n corresponding to the first memory bank BNK1 may be grouped into a first wordline group WG11 and a second wordline group WG12. In addition, the wordlines WL2n+1~WL4n corresponding to the second memory bank BNK2 may be grouped into a third wordline group WG21 and a fourth wordline group WG22.

The plurality of global input-output lines GIO1~GIOm may be cut and grouped into first and second line segment groups LSG11 and LSG12 respectively corresponding to the first and second wordline groups WG11 and WG12, and third and fourth line segment groups LSG21 and LSG22 respectively corresponding to the third and fourth wordline groups WG21 and WG22. For example, each of the plurality of global input-output lines GIO1~GIOm may be cut into first and second line segments LS1 and LS2 respectively corresponding to the first and second line segment groups LSG11 and LSG12, and third and fourth line segments LS3 and LS4 respectively corresponding to the third and fourth line segment groups LSG21 and LSG22.

The plurality of intra-bank switches SWA may control, based on the row address RA and the bank address (for example, based on the first and second bank enable signals generated based on the bank address), electrical connections between the first and second line segment groups LSG11 and LSG12 corresponding to the first memory bank BNK1, and electrical connections between the third and fourth line segment groups LSG21 and LSG22 corresponding to the second memory bank BNK2.

The plurality of inter-bank switches SWB may control, based on the row address RA and the bank address (for example, based on the first and second bank enable signals generated based on the bank address), electrical connections between the second line segment group LSG12 and the third line segment group respectively included in the first and second memory banks BNK1 and BNK2, which are adjacent in the column direction Y.

The lengths of the first through fourth line segment groups LSG11, LSG12, LSG21, and LSG22 along the column direction Y may be equal to each other. For example, the number of the wordlines corresponding to each of the first through fourth line segment groups LSG11, LSG12, LSG21, and LSG22 may be equal to each other.

A first load control circuit 302 may generate a first intra-bank load control signal SLC1 based on the row address RA and the bank address (for example, based on the first bank enable signal BEN1 generated based on the bank address), and generate a first inter-bank load control signal SLC2 based on the bank address.

A second load control circuit 303 may generate a second intra-bank load control signal SLC3 based on the row address RA and the bank address (for example, based on the second bank enable signal BEN2 generated based on the bank address), and generate a fourth inter-bank load control signal SLC4 based on the bank address.

The intra-bank switches SWA forming the first row switch group RSG1 may control electrical connections between the first and second line segment groups LSG11 and LSG12 corresponding to the first memory bank BNK1, based on the first intra-bank load control signal SLC1.

The inter-bank switches SWB forming the second row switch group RSG2 may control electrical connections between the second and third line segment groups LSG12 and LSG21 respectively included in the first and second memory banks BNK1 and BNK2, based on the first inter-bank load control signal SLC2.

The intra-bank switches SWA forming the third row switch group RSG3 may control electrical connections between the third and fourth line segment groups LSG21 and LSG22 corresponding to the second memory bank BNK2, based on the third intra-bank load control signal SLC3.

In some example embodiments, the semiconductor memory device 402 may further include a third memory bank (not shown) adjacent to the second memory bank BNK2 in the column direction Y. In this case, the second inter-bank load control signal SLC4 may be used to control electrical connection between the fourth line segment group LSG22 in the second memory bank BNK2 and one line segment group in the third memory bank.

FIG. 18 is a diagram illustrating operations of intra-bank switches and inter-bank switches included in the semiconductor memory device of FIG. 17.

Referring to FIGS. 3, 17, and 18, the first and second load control circuit 302 and 303 may generate the first and second inter-bank load control signals SLC2 and SLC4 based on one bit Bi of the bank address, respectively.

When the bit Bi of the bank address has a value of 0, an access operation may be performed with respect to the first memory bank BNK1. For example, the first memory bank BNK1 may be determined as the selection memory bank such that the first bank enable signal BEN1 may be activated and the second bank enable signal BEN2 may be deactivated.

When the most significant bit Rq of the row address RA has a value of 0, the selection wordline WLs corresponding to the row address RA may be included in the first wordline group WG11. When the most significant bit Rq of the row address RA has a value of 1, the selection wordline WLs corresponding to the row address RA may be included in the second wordline group WG12.

In this case, the inter-bank switches SWB forming the second row switch group RSG2 may be turned off based on the first inter-bank load control signal SLC2 that is deactivated.

The intra-bank switches SWA forming the first row switch group RSG1 in the first memory bank BNK1 that is selected may be turned on or turned off depending on the most significant bit Rq of the row address RA. For example, the intra-bank switches SWA forming the first row switch group RSG1 may be turned off when the most significant bit Rq of the row address RA has a value of 0, and the intra-bank switches SWA forming the first row switch group RSG1 may be turned on when the most significant bit Rq of the row address RA has a value of 1. In contrast, the intra-bank switches SWA forming the third row switch group RSG3 in the second memory bank BNK2 that is not selected may be turned on regardless of the most significant bit Rq of the row address RA.

When the bit Bi of the bank address has a value of 1, an access operation may be performed with respect to the second memory bank BNK2. For example, the second memory bank BNK2 may be determined as the selection memory bank such that the first bank enable signal BEN1 may be deactivated and the second bank enable signal BEN2 may be activated.

When the most significant bit Rq of the row address RA has a value of 0, the selection wordline WLs corresponding to the row address RA may be included in the third wordline group WG21. When the most significant bit Rq of the row address RA has a value of 1, the selection wordline WLs corresponding to the row address RA may be included in the fourth wordline group WG22.

In this case, the inter-bank switches SWB forming the second row switch group RSG2 may be turned on based on the first inter-bank load control signal SLC2 that is activated.

The intra-bank switches SWA forming the third row switch group RSG3 in the second memory bank BNK2 that is selected may be turned on or turned off depending on the most significant bit Rq of the row address RA. For example, the intra-bank switches SWA forming the third row switch group RSG3 may be turned off when the most significant bit Rq of the row address RA has a value of 0, and the intra-bank switches SWA forming the third row switch group RSG3 may be turned on when the most significant bit Rq of the row address RA has a value of 1. In contrast, the intra-bank switches SWA forming the first row switch group RSG1 in the first memory bank BNK1 that is not selected may be turned on regardless of the most significant bit Rq of the row address RA.

As such, the intra-bank switches in the selection memory bank may be turned on or turned off based on the row address, and the intra-bank switches in the other memory banks that are not selected may be turned on regardless of the row address.

Figure 19:
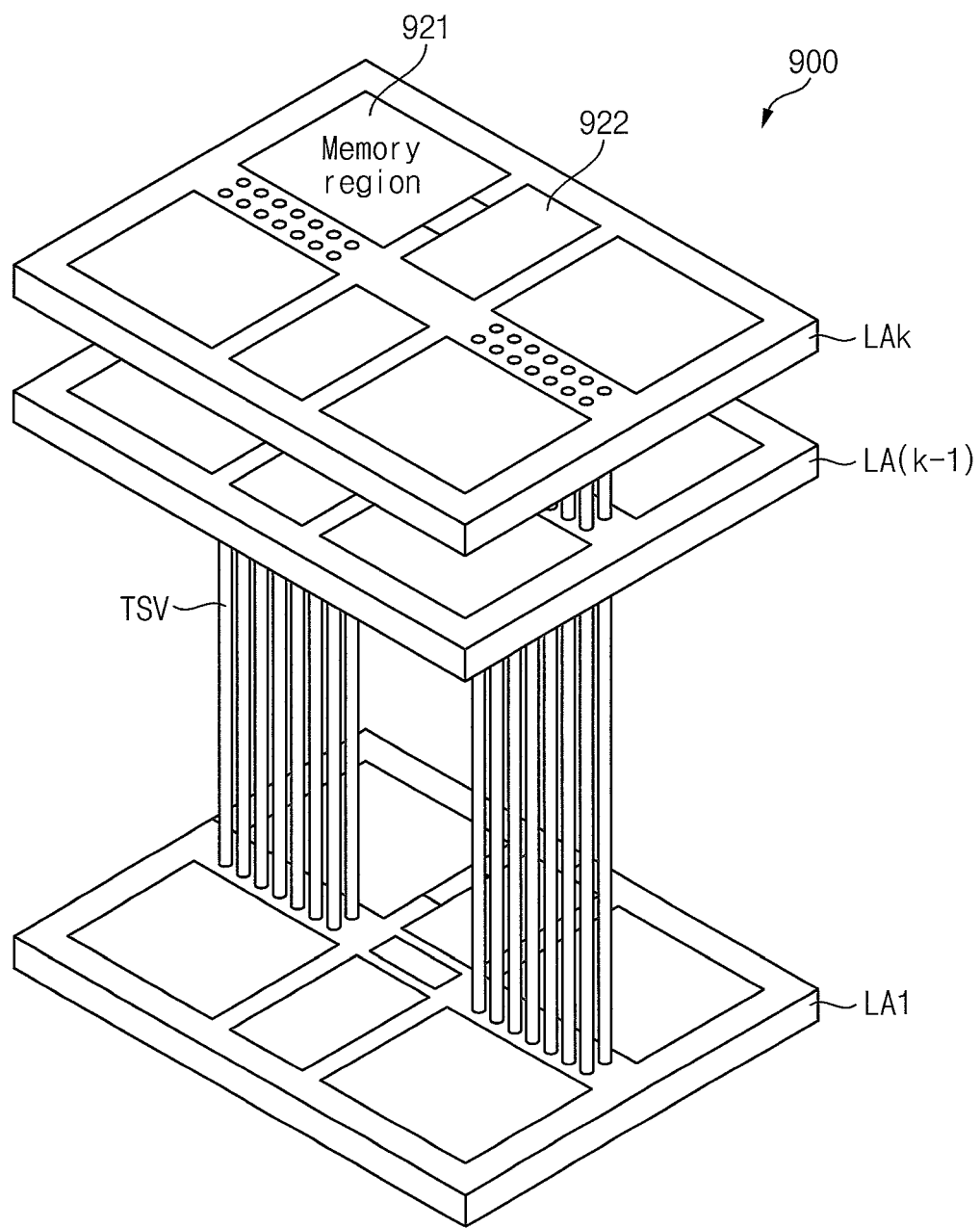
FIGS. 19 and 20 are diagrams illustrating a stacked memory device, according to example embodiments.
Figure 20:
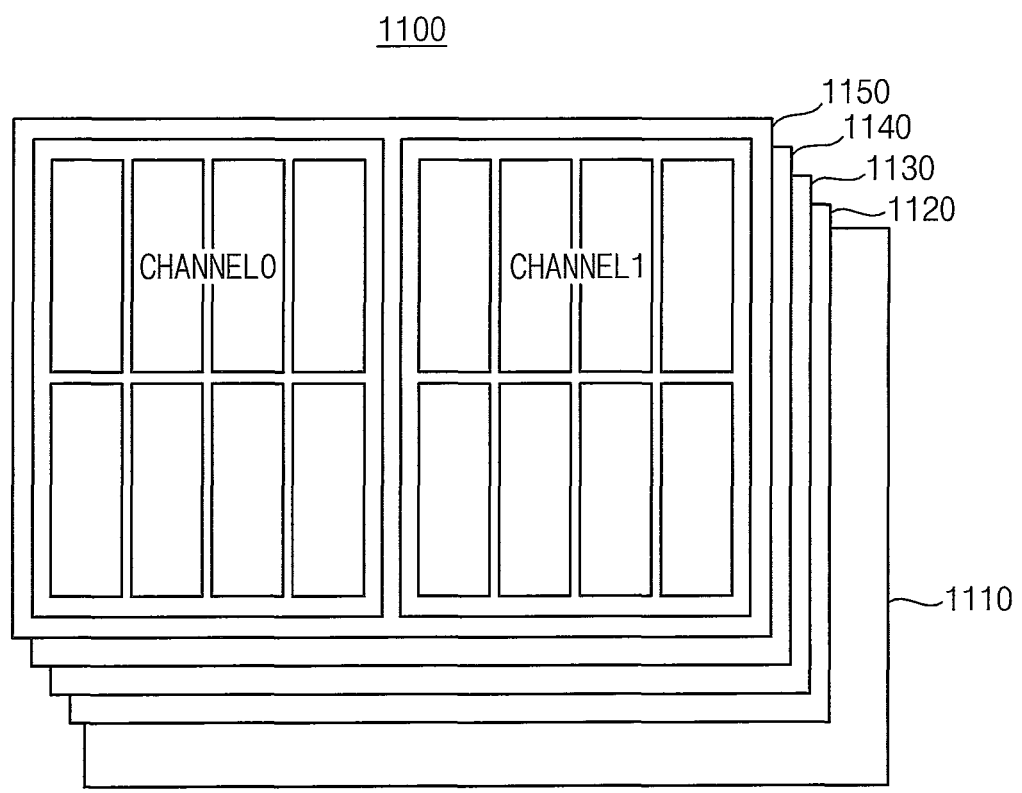

FIGS. 19 and 20 are diagrams illustrating a stacked memory device, according to example embodiments.

Referring to FIG. 19, a semiconductor memory device 900 may include first through kth semiconductor integrated circuit layers LA1 through LAk, in which the lowest first semiconductor integrated circuit layer LA1 is assumed to be an interface or control chip and the other semiconductor integrated circuit layers LA2 through LAk are assumed to be slave chips including core memory chips. The slave chips may form a plurality of memory ranks as described above.

The first through kth semiconductor integrated circuit layers LA1 through LAk may transmit and receive signals between the layers by through-substrate vias TSVs (e.g., through-silicon vias). The lowest first semiconductor integrated circuit layer LA1 as the interface or control chip may communicate with an external memory controller through a conductive structure formed on an external surface.

Each of the first semiconductor integrated circuit layer LA1 through the kth semiconductor integrated circuit layer LAk may include memory regions 921 and peripheral circuits 922 for driving the memory regions 921. For example, the peripheral circuits 922 may include a row-driver for driving wordlines of a memory, a column-driver for driving bitlines of the memory, a data input-output circuit for controlling input-output of data, a command buffer for receiving a command from an outside source and buffering the command, and an address buffer for receiving an address from an outside source and buffering the address.

The first semiconductor integrated circuit layer LA1 may further include a control circuit. The control circuit may control access to the memory region 921 based on a command and an address signal from a memory controller and may generate control signals for accessing the memory region 921.

Each of the semiconductor integrated circuit layers LA2 through LAk corresponding to the slave layer may include a configuration to control the load of the global input-output lines as described above.

FIG. 20 illustrates an example high bandwidth memory (HBM) organization. Referring to FIG. 20, the HBM 1100 may have a stack of multiple DRAM semiconductor dies 1120, 1130, 1140, and 1150. The HBM of the stack structure may be optimized by a plurality of independent interfaces called channels. Each DRAM stack may support up to 8 channels in accordance with the HBM standards. FIG. 20 shows an example stack containing 4 DRAM semiconductor dies 1120, 1130, 1140, and 1150 and each DRAM semiconductor die supports two channels CHANNEL0 and CHANNEL1.

Each channel provides access to an independent set of DRAM banks. Requests from one channel may not access data attached to a different channel. Channels are independently clocked, and need not be synchronous.

The HBM 1100 may further include an interface die 1110 or a logic die at bottom of the stack structure to provide signal routing and other functions. Some function for the DRAM semiconductor dies 1120, 1130, 1140, and 1150 may be implemented in the interface die 1110.

Each of the DRAM semiconductor dies 1120, 1130, 1140, and 1150 may include a configuration to control the load of the global input-output lines as described above.

Figure 21:
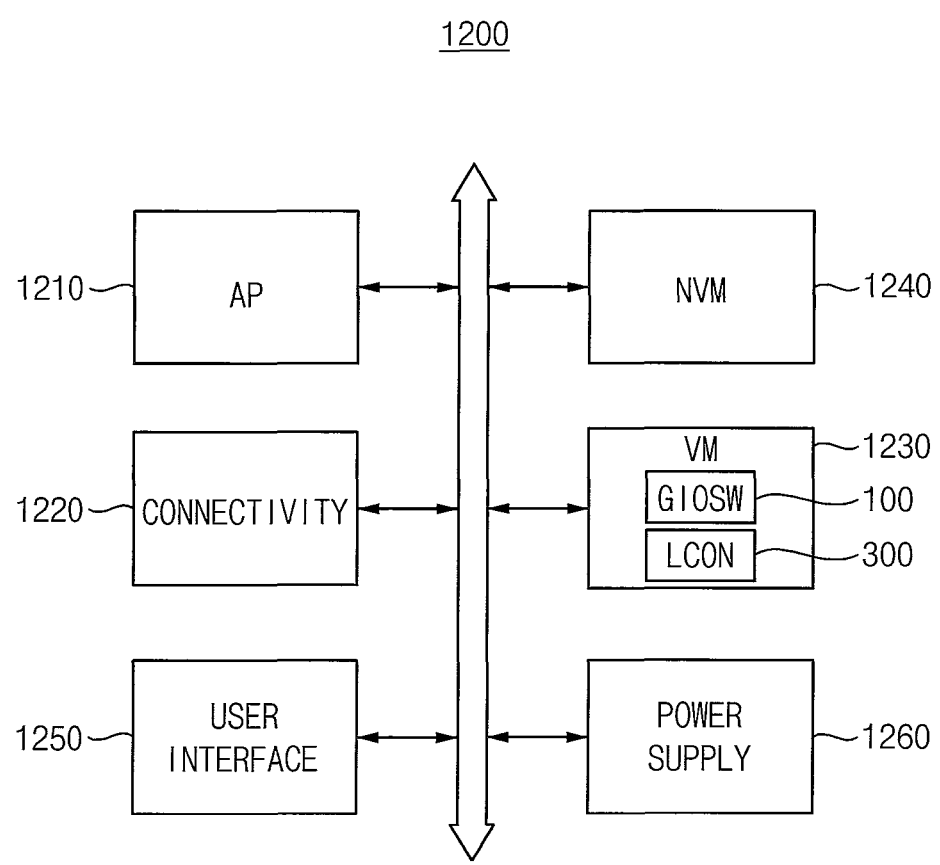
FIG. 21 is a block diagram illustrating a mobile system, according to example embodiments.

FIG. 21 is a block diagram illustrating a mobile system according to example embodiments.

Referring to FIG. 21, a mobile system 1200 includes an application processor (AP) 1210, a connectivity unit 1220, a volatile memory device (VM) 1230, a nonvolatile memory device (NVM) 1240, a user interface 1250, and a power supply 1260. In some embodiments, the mobile system 1200 may be, for example, a mobile phone, a smart phone, a personal digital assistant (PDA), a portable multimedia player (PMP), a digital camera, a music player, a portable game console, a navigation system, or another type of electronic device.

The application processor 1210 may execute applications, e.g., a web browser, a game application, a video player, etc. The connectivity unit 1220 may perform wired or wireless communication with an external device. The volatile memory device 1230 may store data processed by the application processor 1210 or may operate as a working memory. The nonvolatile memory device 1240 may store a boot image for booting the mobile system 1200. The user interface 1250 may include at least one input device, such as a keypad, a touch screen, etc., and at least one output device, such as a speaker, a display device, etc. The power supply 1260 may supply a power supply voltage to the mobile system 1200.

As described above, the volatile memory device 1230 may include a global input-output line switch circuit (GIOSW) 100 and a load control circuit (LCON) 300.

In some example embodiments, the global input-output line switch circuit 100 may include intra-bank switches SWA that are disposed within memory banks as described with reference to FIGS. 1 through 4. In this case, the load control circuit 300 may generate the intra-bank load control signals based on the row address. Based on the intra-bank load control signals, the intra-bank switches SWA may control electrical connections between two line segment groups that are adjacent in the column direction and included in the same memory bank.

In some example embodiments, the global input-output line switch circuit 100 may further include inter-bank switches SWB that are disposed between memory banks as described above with reference to FIGS. 17 and 18, in addition to the intra-bank switches SWA. In this case, the load control circuit 300 may generate intra-bank load control signals based on the row address and the bank address and generate inter-bank control signals based on the bank address. The intra-bank switches SWA may control the electrical connections between the two line segment groups adjacent in the column direction Y in the same bank based on the intra-bank load control signal, and the inter-bank switches SWB may control the electrical connections between two line segment groups respectively included in the two memory banks adjacent in the column direction Y based on the inter-bank load control signal.

As described above, the semiconductor memory device and the method of controlling load of global input-output lines in the semiconductor memory device according to example embodiments may increase operation speed and reduce power consumption by reducing actual driving load of the global input-output lines based on the row address for the access operation with respect to the semiconductor memory device.

Embodiments herein may be applied to any memory device requiring a refresh operation and systems including the memory device. For example, the present inventive concept may be applied to systems such as be a memory card, a solid state drive (SSD), an embedded multimedia card (eMMC), a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, a server system, an automotive device, etc.

The foregoing is illustrative of example embodiments and is not to be construed as limiting thereof. Although a few example embodiments have been described, those skilled in the art will readily appreciate that many modifications are possible in the example embodiments without materially departing from the present inventive concept.

What is claimed is:

1. A semiconductor memory device comprising:
   a plurality of data pads connected to a memory controller;
   a plurality of wordlines extending in a row direction and arranged in a column direction, the plurality of wordlines being grouped into a plurality of wordline groups such that each wordline group includes wordlines adjacent in the column direction, a selection wordline being selected based on a row address;
   a plurality of memory cells connected to the plurality of wordlines;
   a plurality of global input-output lines extending in the column direction and arranged in the row direction to transfer data between the plurality of data pads and the plurality of memory cells, the plurality of global input-output lines being cut into a plurality of line segment groups respectively corresponding to the plurality of wordline groups; and
   a plurality of intra-bank switches configured to control, based on the row address, electrical connections between two line segment groups among the plurality of line segment groups, the two line segment groups being adjacent in the column direction and included in one memory bank,
   wherein the plurality of wordline groups include a first wordline group and a second wordline group,
   wherein the two line segment groups include a first line segment group and a second line segment group such that the first line segment group is nearer to the plurality of data pads than the second line segment group,
   wherein the plurality of intra-bank switches are turned off to electrically separate the first line segment group and the second line segment group when the selection wordline is included in the first wordline group corresponding to the first line segment group, and
   wherein the plurality of intra-bank switches are turned on to electrically connect the first line segment group and the second line segment group when the selection wordline is included in the second wordline group corresponding to the second line segment group.

2. The semiconductor memory device of claim 1, wherein the plurality of intra-bank switches are implemented with transmission gates.

3. The semiconductor memory device of claim 1, wherein the semiconductor memory device includes a plurality of memory banks that are commonly connected to the plurality of global input-output lines.

4. The semiconductor memory device of claim 3, wherein the intra-bank switches that are included in a selection memory bank corresponding to a bank address are turned on or turned off based on the row address.

5. The semiconductor memory device of claim 3, wherein the intra-bank switches that are not included in a selection memory bank corresponding to a bank address are turned on regardless of the row address.

6. The semiconductor memory device of claim 1,
   wherein the plurality of line segment groups include a first line segment group and a second line segment group corresponding to the one memory bank, and
   wherein the intra-bank switches corresponding to the one memory bank are arranged in the row direction in a segment boundary between the first line segment group and the second line segment group to form a row switch group.

7. The semiconductor memory device of claim 6, wherein a length of the first line segment group along the column direction is equal to a length of the second line segment group along the column direction.

8. The semiconductor memory device of claim 6, wherein the intra-bank switches forming the row switch group are simultaneously turned on or simultaneously turned off based on a most significant bit among address bits of the row address.

9. The semiconductor memory device of claim 1,
   wherein the plurality of line segment groups include three or more line segment groups corresponding to the one memory bank, and
   wherein the intra-bank switches corresponding to the one memory bank are arranged in the row direction in two or more segment boundaries between the three or more line segment groups to form two or more row switch groups.

10. The semiconductor memory device of claim 9, wherein lengths of the three or more line segment groups along the column direction are equal to each other.

11. The semiconductor memory device of claim 9, wherein the intra-bank switches forming each of the two or more row switch groups are simultaneously turned on or simultaneously turned off based on two or more most significant bits among address bits of the row address.

12. The semiconductor memory device of claim 1, further comprising:
    a load control circuit configured to generate an intra-bank load control signal based on the row address,
    wherein the plurality of intra-bank switches control the electrical connections between the two line segment groups corresponding to the one memory bank based on the intra-bank load control signal.

13. The semiconductor memory device of claim 1, further comprising:
    a plurality of memory banks connected commonly to the plurality of global input-output lines; and
    a plurality of inter-bank switches configured to control, based on a bank address, electrical connections between two line segment groups respectively included in two memory banks adjacent in the column direction among the plurality of memory banks.

14. The semiconductor memory device of claim 13,
    wherein the two memory banks adjacent in the column direction include a first memory bank and a second memory bank such that the first memory bank is nearer to the plurality of data pads than the second memory bank,
    wherein the plurality of inter-bank switches are turned off to electrically separate the two line segment groups respectively included in the first memory bank and the second memory bank when the bank address corresponds to the first memory bank, and wherein the plurality of inter-bank switches are turned on to electrically connect the two line segment groups respectively included in the first memory bank and the second memory bank when the bank address corresponds to the second memory bank.

15. The semiconductor memory device of claim 13, wherein the two memory banks adjacent in the column direction include a first memory bank and a second memory bank such that the first memory bank is nearer to the plurality of data pads than the second memory bank, and wherein the intra-bank switches corresponding to the first memory bank are turned on or turned off based on the row address when the bank address corresponds to the first memory bank, and the intra-bank switches corresponding to the first memory bank are turned on regardless of the row address when the bank address corresponds to the second memory bank.

16. The semiconductor memory device of claim 13, further comprising:

a load control circuit configured to generate an intra-bank load control signal based on the row address and the bank address and generate an inter-bank load control signal based on the bank address, wherein the plurality of intra-bank switches control the electrical connections between the two line segment groups in the same memory bank based on the intra-bank load control signal, and wherein the plurality of inter-bank switches control the electrical connections between two line segment groups respectively included the two memory banks adjacent in the column direction based on the inter-bank load control signal.

17. A semiconductor memory device comprising:

a plurality of data pads connected to a memory controller;

a plurality of wordlines extending in a row direction and arranged in a column direction, the plurality of wordlines being grouped into a plurality of wordline groups such that each wordline group includes wordlines adjacent in the column direction, a selection wordline being selected based on a row address;

a plurality of memory cells connected to the plurality of wordlines, the plurality of memory cells forming a plurality of memory banks, a selection memory bank being selected based on a bank address;

a plurality of global input-output lines extending in the column direction and arranged in the row direction to transfer data between the plurality of data pads and the plurality of memory cells, the plurality of global input-output lines being cut into a plurality of line segment groups respectively corresponding to the plurality of wordline groups;

a plurality of intra-bank switches configured to control, based on the bank address and the row address, electrical connections between two line segment groups among the plurality of line segment groups, the two line segment groups being adjacent in the column direction and included in one memory bank; and a plurality of inter-bank switches configured to control, based on the bank address, electrical connections between two line segments groups respectively included in two memory banks adjacent in the column direction among the plurality of memory banks, wherein the intra-bank switches that are included in the selection memory bank corresponding to the bank address are turned on or turned off based on the row address, and the intra-bank switches that are not included in the selection memory bank corresponding to the bank address are turned on regardless of the row address.

18. A method of controlling load of global input-output lines of a semiconductor memory device, comprising:

cutting a plurality of global input-output lines to transfer data between a plurality of data pads and a plurality of memory cells into a plurality of line segment groups;

connecting two line segment groups through a plurality of intra-bank switches, the two line segment groups included in one memory bank; and controlling switching operations of the plurality of intra-bank switches based on a row address, wherein the controlling the switching operations of the plurality of intra-bank switches includes turning on or turning off intra-bank switches that are included in the one memory bank based on the row address, and turning on the intra-bank switches that are not included in the one memory bank corresponding to the bank regardless of the row address.

\* \* \* \* \*